US012660165B2

(12) United States Patent
Wu et al.

(10) Patent No.: US 12,660,165 B2
(45) Date of Patent: Jun. 16, 2026

(54) SEMICONDUCTOR STRUCTURE AND MANUFACTURING METHOD THEREFOR

(71) Applicant: CHANGXIN MEMORY TECHNOLOGIES, INC., Hefei City (CN)

(72) Inventors: Runping Wu, Hefei (CN); Daejoong Won, Hefei (CN); Soonbyung Park, Hefei (CN); Kanyu Cao, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 452 days.

(21) Appl. No.: 18/295,331

(22) Filed: Apr. 4, 2023

(65) Prior Publication Data

US 2023/0397407 A1 Dec. 7, 2023

(30) Foreign Application Priority Data

Jun. 1, 2022 (CN) .......................... 202210620889.8

(51) Int. Cl.
H10B 12/00 (2023.01)
(52) U.S. Cl.
CPC ........... H10B 12/34 (2023.02); H10B 12/053 (2023.02); H10B 12/482 (2023.02)

(58) Field of Classification Search
CPC ..... H10B 12/34; H10B 12/482; H10B 12/053
See application file for complete search history.

(56) References Cited

U.S. PATENT DOCUMENTS

| | | | |
|---|---|---|---|
| 9,837,551 B2 * | 12/2017 | Hondo | H10D 30/6755 |
| 2017/0323948 A1 * | 11/2017 | Basker | H10D 64/513 |
| 2022/0085214 A1 | 3/2022 | Mizukami et al. | |

OTHER PUBLICATIONS

Raman, et al., "Compute-in-eDRAM with Backend Integrated Indium Gallium Zinc Oxide Transistors", Department of Electrical and Computer Engineering, The University of Texas at Austin, 2021, 5 pages.

* cited by examiner

*Primary Examiner* — Richard A Booth
(74) *Attorney, Agent, or Firm* — Syncoda LLC; Feng Ma

(57) ABSTRACT

Disclosed in the embodiments of the disclosure are a semiconductor structure and a manufacturing method therefor. The semiconductor structure includes: a substrate; a plurality of grooves, located in the substrate and extending in a first direction; a plurality of word line structures, located in the grooves; and a plurality of semiconductor layers, each at least partially located between a word line structure and an inner wall of a groove. The semiconductor layer includes oxide semiconductor material.

19 Claims, 20 Drawing Sheets

| A substrate is provided | 301 |

↓

| Grooves extending in a first direction are formed in the substrate | 302 |

↓

| Semiconductor layers are formed, each at least partially covering an inner wall of a groove, and a material of the semiconductor layers includes oxide semiconductor material | 303 |

↓

| Word line structures are formed, and a word line structure is located in the groove and at least cover part of the semiconductor layer | 304 |

FIG. 3

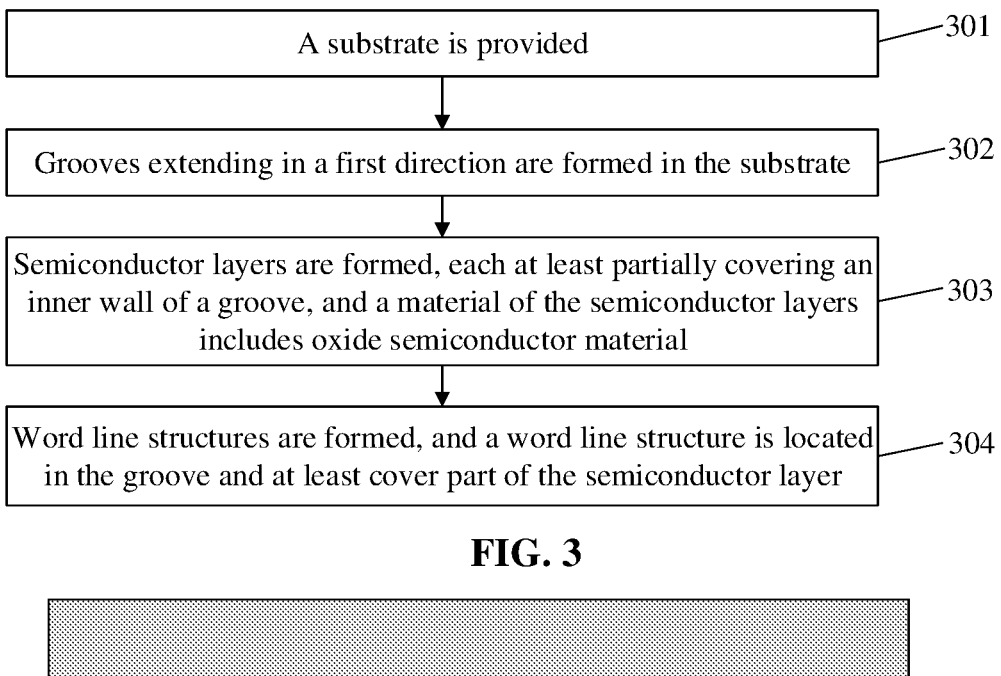

SEMICONDUCTOR STRUCTURE AND MANUFACTURING METHOD THEREFOR

CROSS-REFERENCE TO RELATED APPLICATION

This application claims priority to Chinese Patent Application No. 202210620889.8, filed on Jun. 1, 2022, the disclosure of which is hereby incorporated by reference in its entirety.

BACKGROUND

A semiconductor structure, such as a Dynamic Random Access Memory (DRAM), typically includes a transistor and a buried word line structure, and the word line structure is used to control the transistor on and off.

However, as the semiconductor structure continues to evolve toward miniaturization and high integration, the further reduction in the size of a word line leads to an increase in Gate Induced Drain Leakage (GIDL), which degrades the current drivability of the transistor, thereby reducing the performance of the semiconductor structure.

SUMMARY

The disclosure relates to the field of semiconductor manufacturing. An embodiment of the disclosure provides a semiconductor structure. The semiconductor structure includes: a substrate, a plurality of grooves, a plurality of word line structures and a plurality of semiconductor layers.

The plurality of grooves are located in the substrate and extend in a first direction.

The plurality of word line structures are located in the grooves.

Each of the semiconductor layers is at least partially located between a word line structure and an inner wall of a groove. The semiconductor layer includes oxide semiconductor material.

An embodiment of the disclosure further provides a method for manufacturing a semiconductor structure. The method includes the following operations.

A substrate is provided.

Grooves extending in a first direction are formed in the substrate.

Semiconductor layers are formed, and each of the semiconductor layers at least partially covers an inner wall of the groove. A material of the semiconductor layer includes oxide semiconductor material.

Word line structures are formed. A word line structure is located in the groove and at least covers part of the semiconductor layer.

According to the semiconductor structure and the manufacturing method therefor provided in the embodiments of the present disclosure, the semiconductor structure includes: a substrate; a plurality of grooves, located in the substrate and extending in a first direction; a plurality of word line structures, located in the grooves; and a plurality of semiconductor layers, each at least partially located between a word line structure and an inner wall of a groove. The semiconductor layer includes oxide semiconductor material. The semiconductor structure provided in the embodiments of the present disclosure includes the semiconductor layers disposed between the word line structures and inner walls of the grooves. The material of the semiconductor layers includes the oxide semiconductor material. The oxide semiconductor material may act as a channel for transmitting charges. Since the oxide semiconductor material has higher carrier mobility and lower leakage current, GIDL leakage current can be effectively alleviated or eliminated, such that the on/off current ratio and current drivability of a transistor can be improved, thereby improving the capability of the word line structure for driving the transistor, reducing power consumption, and improving the performance of the semiconductor structure.

The details of one or more embodiments of the disclosure are set forth in the drawings and the description below. Other features and advantages of the disclosure will be apparent from the drawings and the claims from the specification.

BRIEF DESCRIPTION OF THE DRAWINGS

In order to more clearly illustrate the technical solutions in the embodiments of the disclosure, the drawings used in the embodiments will be briefly described below. It is apparent that the drawings in the following descriptions are merely some embodiments of the disclosure. Other drawings can be obtained from those skilled in the art according to these drawings without any creative work.

FIG. 3 is a flowchart of a method for manufacturing a semiconductor structure according to an embodiment of the present disclosure.

FIG. 4 is a schematic diagram of a cross-sectional structure, taken along the A-A' line of FIG. 1A, of a step of a method for manufacturing a semiconductor structure according to an embodiment of the present disclosure.

DETAILED DESCRIPTION

Figure 1A:
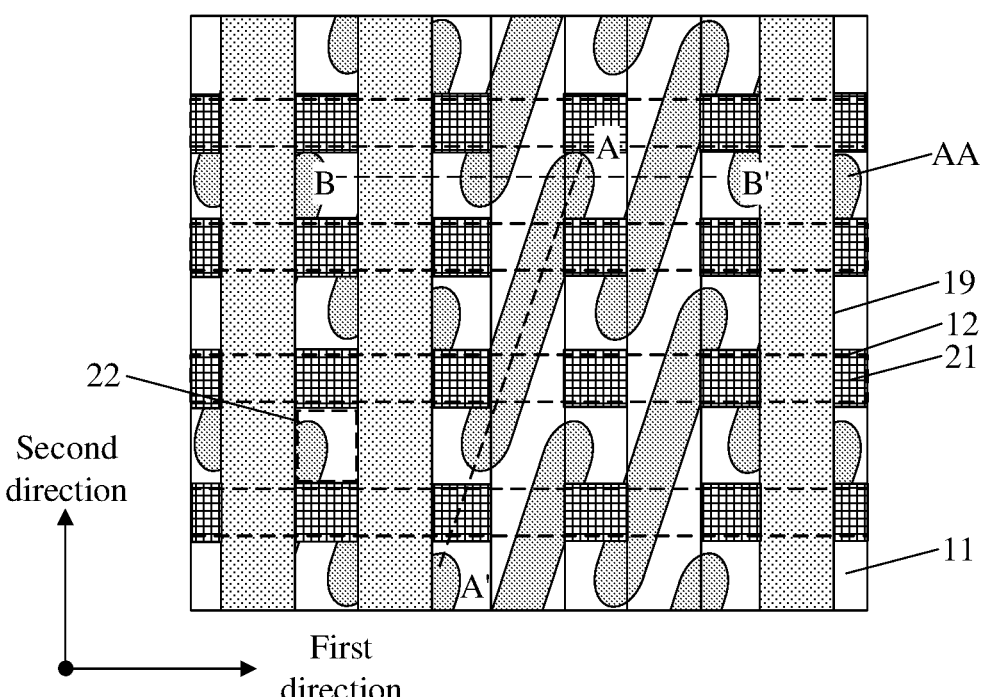
FIG. 1A is a schematic top view of a semiconductor structure according to an embodiment of the present disclosure.

Exemplary implementations disclosed in the disclosure are described in detail below with reference to the accompanying drawings. Although the accompanying drawings illustrate the exemplary implementations of the disclosure, it should be understood that the embodiments of the disclosure can be implemented in various forms, and should not be limited by the particular implementations described herein. On the contrary, the purpose of providing these implementations is to more thoroughly understand the embodiments of the disclosure, and the scope of the disclosure of the embodiments of the disclosure is fully conveyed to those skilled in the art.

In the following description, numerous specific details are provided for providing a more thorough understanding of the disclosure. However, it would be apparent to those skilled in the art that the embodiments of the disclosure can be implemented without one or more of these details. In other examples, in order to avoid confusion with the embodiments of the disclosure, some technical features known in the art are not described. That is, not all features of actual embodiments are described herein, and well-known functions and structures are not described in detail.

In the accompanying drawings, for clarity, the sizes of layers, areas and elements and their relative sizes may be exaggerated. Like reference numerals refer to like elements throughout.

It should be understood that when an element or layer is referred to as being "on", "adjacent to", "connected to" or "coupled to" other elements or layers, it can be directly on, adjacent to, connected to or coupled to the other elements or layers, or intervening elements or layers may be present. In contrast, when an element is referred to as being "directly on", "directly adjacent to", "directly connected to" or "directly coupled to" other elements or layers, intervening elements or layers are absent. It should be understood that although the terms first, second, third, etc., may be used to describe various elements, components, areas, layers and/or portions, those elements, components, areas, layers and/or portions may not be limited by these terms. The terms are merely used to distinguish one element, component, area, layer or portion from another element, component, area, layer or portion. Thus, a first element, component, area, layer or portion discussed below may be referred to as a second element, component, area, layer or portion without departing from the teachings of the embodiments of the disclosure. Moreover, when a second element, component, area, layer or portion is discussed, it does not mean that a first element, component, area, layer or portion is necessarily present in the embodiments of the disclosure.

Spatial relation terms, such as "under", "below", "lower", "beneath", "above", "upper", etc., are used herein for ease of description to describe the relationship between one element or feature and another element or feature as illustrated in the drawings. It should be understood that the spatial relation terms are intended to encompass different orientations of a device in use and operation, in addition to the orientation depicted in the drawings. For example, if the device in the drawings is turned over, an element or feature described as "below" or "beneath" or "under" another element would be oriented "above" the other element or feature. Thus, the exemplary terms "below" and "under" can encompass both an orientation of above and below. The device may be additionally oriented (rotated 90 degrees or at other orientations) and the spatial relation descriptors used herein are interpreted accordingly.

The terms used herein is for the purpose of describing particular embodiments only and is not intended to limit the embodiments of the disclosure. As used herein, the singular forms "a", "an" and "said/the" are intended to include the plural forms as well, unless the context clearly indicates otherwise. It should be further understood that the terms "comprises" and/or "comprising", when used in this specification, the presence of the features, integers, steps, operations, elements, and/or components is determined, but the presence or addition of one or more other features, integers, steps, operations, elements, components, and/or groups thereof is not precluded. As used herein, the term "and/or" includes any and all combinations of one or more of the associated listed items.

A semiconductor structure, such as a DRAM, typically includes a transistor, a buried word line structure, a bit line structure and an information storage structure. The word line structure controls the transistor on and off. The bit line structure is electrically connected to the drain of the transistor by means of a bit line plug. The information storage structure is electrically connected to the source of the transistor by means of a storage node plug.

However, as the semiconductor structure continues to evolve toward miniaturization and high integration, the further reduction in the size of a word line leads to an increase in GIDL, which degrades the current drivability of the transistor, thereby reducing the performance of the semiconductor structure. In addition, as the bit line plug and the storage node plug shrink, the contact area of the bit line plug, the storage node plug and the transistor decreases, and the contact resistance increases. In addition, in the related art, materials of the bit line plug and the storage node plug are polysilicon. The contact resistance between the polysilicon and a source area and a drain area is relatively large.

Based on this, the following technical solutions of the embodiments of the present disclosure are provided. Specific implementations of the disclosure are described below in detail with reference to the drawings. While the embodiments of the disclosure are described in detail, for ease of descriptions, a schematic diagram may be partially enlarged according to a non-general scale, and the schematic diagram is only an example, which should not limit a scope of protection of the disclosure herein.

Figure 1B:
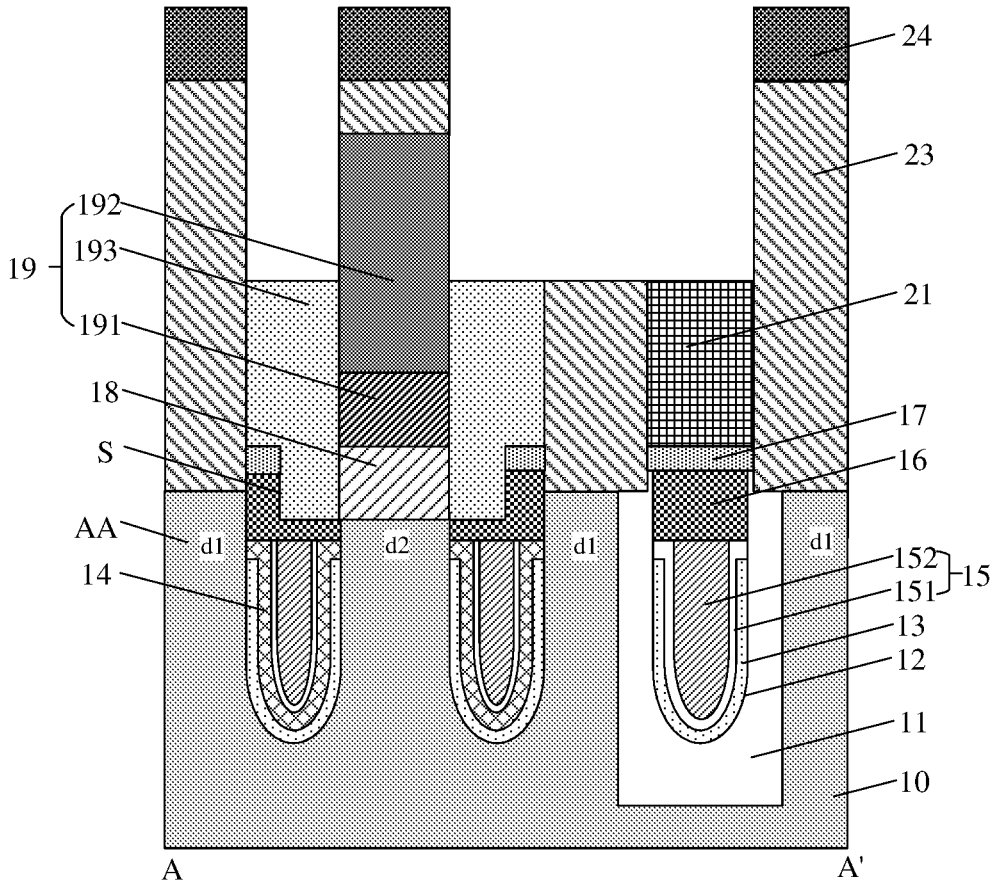
FIG. 1B is a schematic diagram of a cross-sectional structure taken along an A-A' line of FIG. 1A.
Figure 1C:
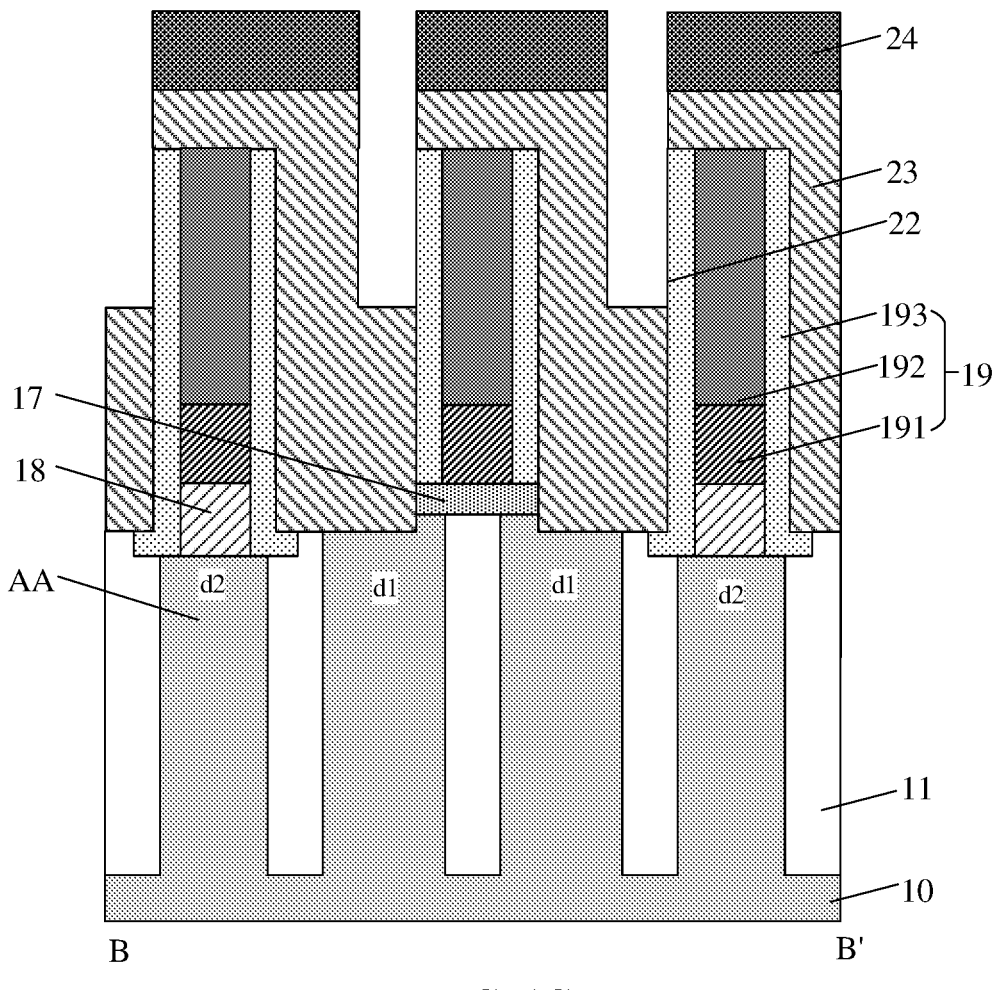
FIG. 1C is a schematic diagram of a cross-sectional structure taken along a B-B' line of FIG. 1A.
Figure 2A:
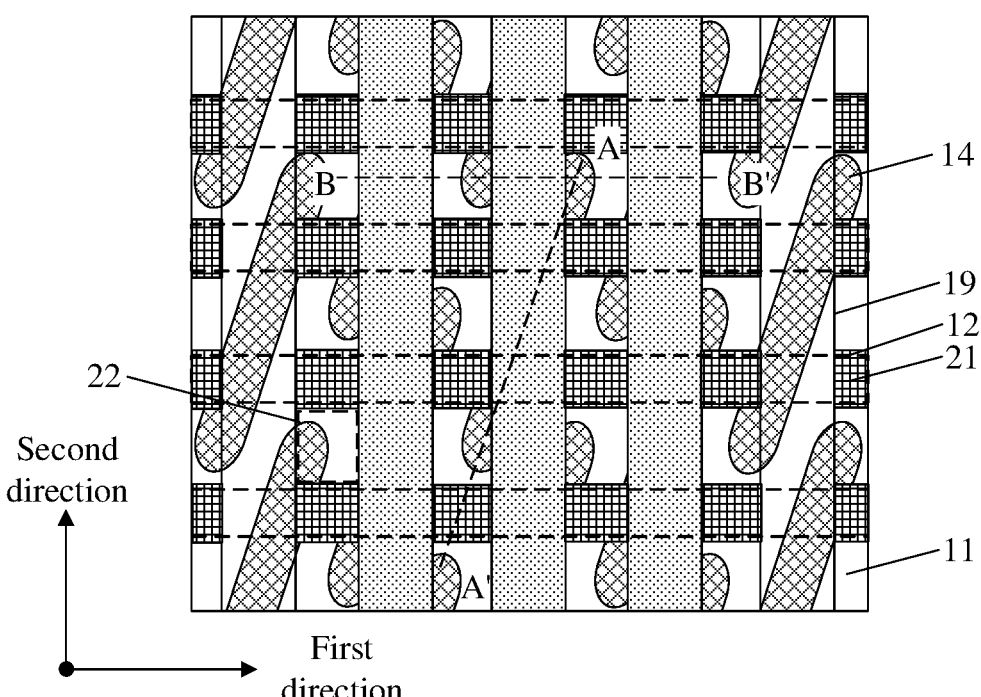
FIG. 2A is a schematic top view of a semiconductor structure according to another embodiment of the present disclosure.
Figure 2B:
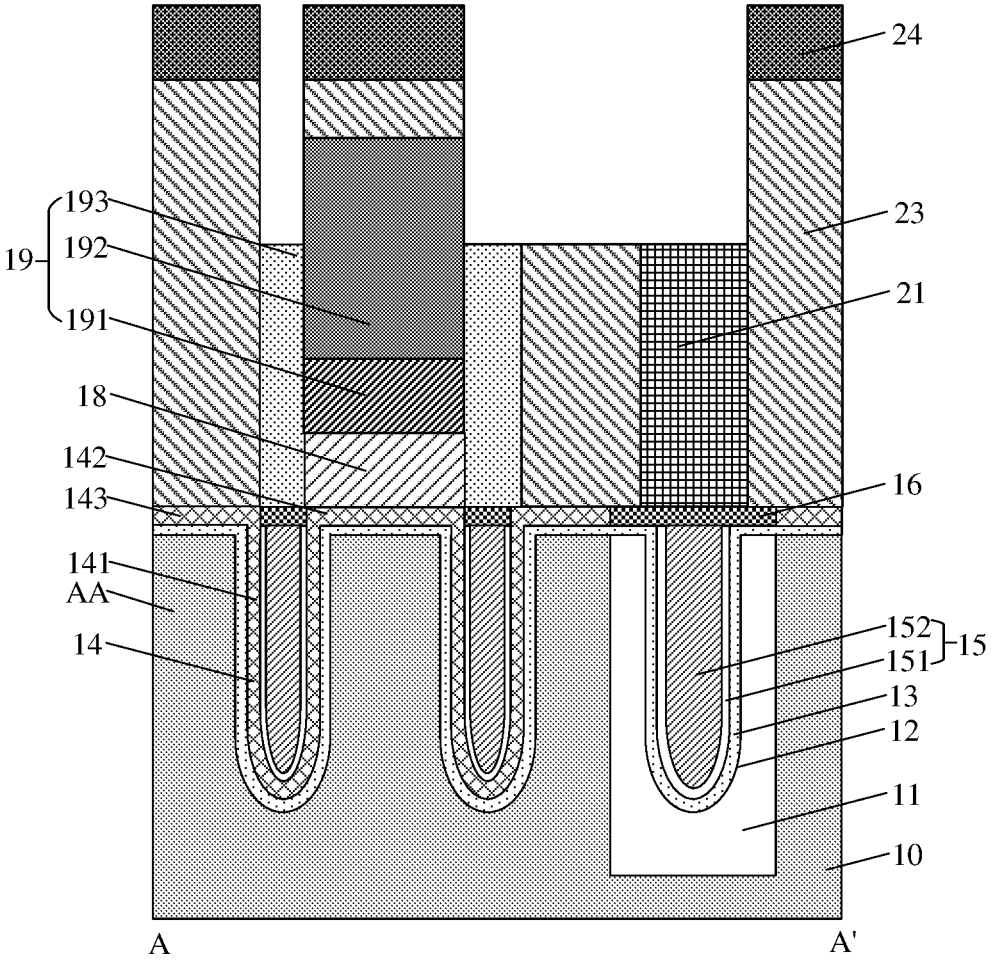
FIG. 2B is a schematic diagram of a cross-sectional structure taken along an A-A' line of FIG. 2A.
Figure 2C:
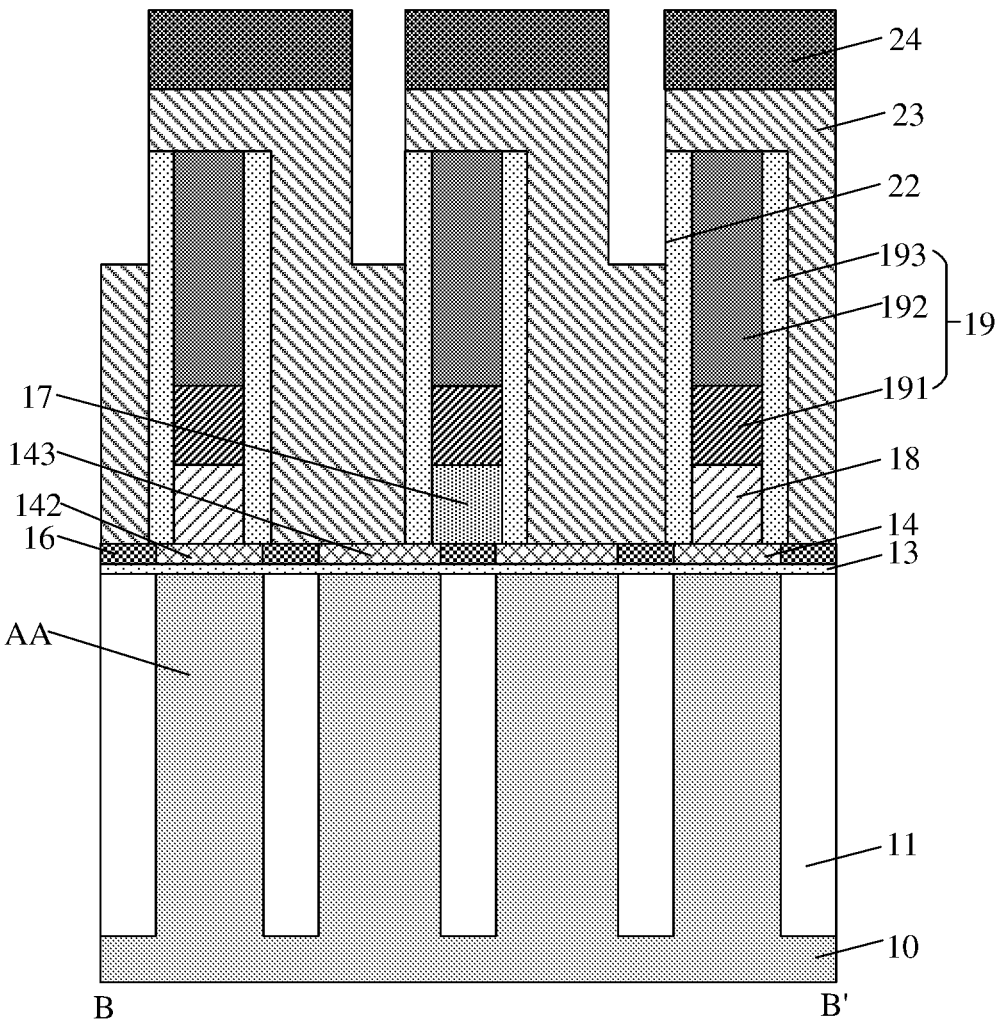
FIG. 2C is a schematic diagram of a cross-sectional structure taken along a B-B' line of FIG. 2A.

FIG. 1A is a schematic top view of a semiconductor structure according to an embodiment of the present disclosure; FIG. 1B is a schematic diagram of a cross-sectional structure taken along an A-A' line of FIG. 1A; and FIG. 1C is a schematic diagram of a cross-sectional structure taken along a B-B' line of FIG. 1A. FIG. 2A is a schematic top view of a semiconductor structure according to another embodiment of the present disclosure; FIG. 2B is a schematic diagram of a cross-sectional structure taken along an A-A' line of FIG. 2A; and FIG. 2C is a schematic diagram of a cross-sectional structure taken along a B-B' line of FIG. 2A. The semiconductor structure provided in the embodiments of the present disclosure is further described below with reference to FIG. 1A to FIG. 2C.

As shown in the figures, the semiconductor structure includes: a substrate 10; a plurality of grooves 12, located in the substrate 10 and extending in a first direction; a plurality of word line structures 15, located in the grooves 12; and a plurality of semiconductor layers 14, each at least partially located between a word line structure 15 and an inner wall of a groove 12. The semiconductor layer 14 includes oxide semiconductor material.

In an actual operation, the semiconductor structure provided in the embodiments of the present disclosure may be a Three-Dimensional Dynamic Random Access Memory (3D DRAM), but is not limited herein. The semiconductor structure may also be any semiconductor structure having a buried gate.

The substrate may be a semiconductor substrate, and may include at least one elementary semiconductor material (for example, a silicon (Si) substrate, or a germanium (Ge) substrate), at least one III-V compound semiconductor material, at least one II-VI compound semiconductor material, at least one organic semiconductor material, or other semiconductor materials known in the art. In a specific embodiment, the substrate is the Si substrate. The Si substrate may or may not be doped.

The plurality of grooves 12 are arranged in the second direction that interacts with the first direction. In some embodiments, the first direction is perpendicular to the second direction. However, it is not limited herein, and the first direction may also obliquely interact with the second direction.

In an embodiment, the substrate 10 includes isolation structures 11 and a plurality of discrete active areas AA that are separated by the isolation structures 11. An extending direction of the active areas AA interacts with the first direction. The two adjacent grooves 12 separate an active area AA into two end portions and an intermediate area. The active area AA is exposed by the groove 12. Specifically, as shown in FIG. 1A to FIG. 1B, the isolation structure 11 is disposed between the plurality of active areas AA arranged in parallel. The groove 12 penetrates the active area AA and the isolation structure 11. The material of the isolation structure 11 may include one or more of oxides (such as silicon oxide), nitrides (such as silicon nitride) and nitrogen oxides (such as silicon nitride).

In an embodiment, each active area AA includes first source/drain doped areas d1 located on the two end portions and a second source/drain doped area d2 located in the intermediate area. The first source/drain doped areas d1 and the second source/drain doped area d2 are separated by the grooves 12. The doping types of the first source/drain doped areas d1 and the second source/drain doped area d2 may be the same; and the doping types of the first source/drain doped areas d1 and the second source/drain doped area d2 may be different from the doping type of the substrate 10.

In an embodiment, an orthographic projection of the semiconductor layer 14 on a plane of the substrate 10 at least partially overlaps with an orthographic projection of the active area AA on the plane of the substrate 10. In some embodiments, the semiconductor layer 14 covers at least part of the surface of the active area AA exposed by the groove 12. The first source/drain doped area d1 and the second source/drain doped area d2 are respectively located on two sides of the semiconductor layer 14 and are in contact with the semiconductor layer 14. An upper surface of the semiconductor layer 14 is lower than an upper surface of the substrate 10; or, the upper surface of the semiconductor layer 14 is flush with the upper surface of the substrate 10.

In the embodiments of the present disclosure, the semiconductor layer 14 is disposed between the word line structure 141 and the substrate 10. The material of the semiconductor layer 14 includes the oxide semiconductor material. The oxide semiconductor material may act as a channel for transmitting charges. Since the oxide semiconductor material has higher carrier mobility and lower leakage current, GIDL leakage current can be effectively alleviated or eliminated, such that the on/off current ratio and current drivability of a transistor can be improved, thereby improving the capability of the word line structure 15 for driving the transistor, reducing power consumption, and improving the performance of the semiconductor structure.

In an embodiment, the oxide semiconductor material includes $In_xGa_yZn_{1-x-y}O$, where x is greater than or equal to 0 or is less than or equal to 1, and y is greater than or equal to 0 or is less than or equal to 1, for example, a material with a chemical formula $In_{0.5}Ga_{0.5}Zn_2O$. However, the material is not limited thereto, the oxide semiconductor material also includes at least one of indium oxide, tin oxide, In—Zn oxides, Sn—Zn oxides, Al—Zn oxides, In—Ga oxides, In—Al—Zn oxides, In—Sn—Zn oxides, Sn—Ga—Zn oxides, Al—Ga—Zn oxides, or Sn—Al—Zn oxides.

However, the material is not limited thereto, the oxide semiconductor material may also include at least one of In—Hf—Zn oxides, In—La—Zn oxides, In—Ce—Zn oxides, In—Pr—Zn oxides, In—Nd—Zn oxides, In—Sm—Zn oxides, In—Eu—Zn oxides, In—Gd—Zn oxides, In—Tb—Zn oxides, In—Dy—Zn oxides, In—Ho—Zn oxides, In—Er—Zn oxides, In—Tm—Zn oxides, In—Yb—Zn oxides, In—Lu—Zn oxides, and quaternary metal oxides such as In—Sn—Ga—Zn oxides, In—Hf—Ga—Zn oxides, In—Al—Ga—Zn oxides, In—Sn—Al—Zn oxides, In—Sn—Hf—Zn oxides, or In—Hf—Al—Zn oxides.

Optionally, the oxide semiconductor material may be an undoped oxide semiconductor material, or a doped oxide semiconductor material. Specifically, a doping agent for doping the oxide semiconductor material includes more than one of boron, nitrogen, phosphorus and arsenic, or more than one of helium, neon, argon, krypton, and xenon. Alternatively, the doping agent is hydrogen, but is not limited thereto, and the doping agent may also be any combination of the above materials according to requirements.

In an embodiment, the semiconductor layer 14 has P-type doping. But the semiconductor layer is not limited thereto, the semiconductor layer 14 may also have N-type doping. It is to be understood that, when the semiconductor layer 14 has P-type doping, the first source/drain doped area d1 and the second source/drain doped area d2 have N-type doping; on the contrary, when the semiconductor layer 14 has N-type doping, the first source/drain doped area d1 and the second source/drain doped area d2 have P-type doping.

In an embodiment, the semiconductor structure further includes insulation layers 13. An insulation layer 13 is at least located between the substrate 10 and the semiconductor layer 14. As shown in FIG. 1B, in some embodiments, the insulation layer 13 covers the bottom surface and part of the sidewall of the groove 12, and an upper surface of the insulation layer 13 located on the sidewall is lower than the upper surface of the substrate 10. The semiconductor layer 14 covers the insulation layer 13 and areas of the sidewall of the groove 12 that are not covered by the insulation layer 13, and are in contact with the exposed areas. In the embodiments of the present disclosure, by disposing the insulation layer 13 between the substrate 10 and the semiconductor layer 14, channel leakage current and GIDL leakage current can be effectively reduced. A material of the insulation layer 13 includes oxide such as silicon oxide. The insulation layers 13 may be formed by means of a thermal oxidation process, such as a wet oxidation process of furnace or an In-Situ Steam Generation (ISSG) process. It is to be understood that, when the insulation layers 13 may be formed by means of the thermal oxidation process, the insulation layers

13 cover at least part of the surfaces of the active areas AA exposed by the grooves 12. But the insulation layers are not limited thereto, the insulation layers 13 may also be formed by means of a Chemical Vapor Deposition (CVD) process.

There are a plurality of word line structures 15, and the plurality of word line structures 15 are arranged in the second direction. As shown in FIG. 2B, each word line structure 15 includes a conductive layer 152 and a gate dielectric layer 151 interposed between the conductive layer 152 and the semiconductor layer 14. A material of the conductive layers 152 includes tungsten (W), copper (Cu), titanium (Ti), tantalum (Ta), titanium nitride (TiN), tantalum nitride (TaN), metal silicides, metal alloys, or any combination thereof, for example, Titanium Nitride (TiN). A material of the gate dielectric layer 151 may be a high dielectric constant material, for example, may be tantalum oxide, hafnium oxide, zirconium oxide, niobium oxide, titanium oxide, barium oxide, strontium oxide, yttrium oxide, lanthanum oxide, praseodymium oxide, or barium strontium titanate. In the embodiments of the present disclosure, a high dielectric constant material is used as the material of the gate dielectric layers 151, such that the current drivability of the transistor can be further improved.

In an embodiment, upper surfaces of the word line structures 15 are lower than the upper surface of the substrate 10. The semiconductor structure further includes word line cover layers 16, and the word line cover layers 16 cover the word line structures 15. A material of the word line cover layers 16 includes TiN.

As shown in FIG. 1B and FIG. 1C, in an embodiment, the semiconductor structure further includes: a plurality of bit line structures 19 located on the substrate 10, extending in the second direction and arranged in the first direction; and first contact plugs 18, each located under the bit line structure 19 and above the second source/drain doped area d2. The first contact plugs 18 are electrically connected to bit line structures 19 and the second source/drain doped areas d2. Specifically, each of the bit line structures 19 includes a bit line 191, a bit line cover layer 192 and bit line sidewall layers 193. The bit line cover layer 192 covers an upper surface of the bit line 191. The bit line sidewall layers 193 cover the bit line cover layer 192, the bit line 191 and sidewalls of the first contact plug 18. A material of the first contact plugs 18 includes polysilicon. The bit lines 191 include TiN layers and W layers located on the TiN layer. Materials of the bit line cover layer 192 and the bit line sidewall layer 193 include the silicon nitride.

In an embodiment, the semiconductor structure further includes: a dielectric layer 17, at least partially located between the bit line structure 19 and the substrate 10; and a trench S, located under the bit line structure 19. The trench S is formed by removing part of the dielectric layer 17, part of the second source/drain doped area d2 located under the part of the dielectric layers 17, part of the word line cover layers 16 and part of the isolation structure 11. The first contact plug 18 is located in the trench S, and the upper surface of the first contact plug 18 is flush with the upper surface of the trench S. There are gaps between the first contact plug 18 and the substrate 10 as well as the dielectric layer 17. The bit line sidewall layers 193 are filled in the gaps. A material of the dielectric layer 17 includes silicon nitride.

As shown in FIG. 1A to FIG. 1C, in an embodiment, the semiconductor structure further includes a plurality of second contact plugs 23 and a plurality of contact pads 24. The second contact plugs 23 are located under the contact pads 24, and are connected to the first source/drain doped areas d1. In some embodiments, a material of the second contact plugs 23 is TiN. Compared with the polysilicon mentioned in the related art, the TiN has better conductivity, such that the second contact plugs 23 and the first source/drain doped areas d1 have smaller contact resistance. But the material is not limited thereto, the material of the second contact plugs 23 may also be other materials with good conductivity, for example, tungsten, tungsten nitride, titanium, and the like. A material of the contact pads 24 includes tungsten.

In an embodiment, the semiconductor structure further includes a plurality of isolation barriers 21 located above the substrate 10. The plurality of isolation barriers 21 extend in the first direction and are arranged in the second direction. The plurality of bit line structures 19 and the plurality of isolation barriers 21 interact with each other, to define a plurality of openings 22. The second contact plug 23 is at least partially located in the opening 22. As shown in FIG. 1C, the second contact plug 23 also covers part of the top and part of the sidewall of the bit line structure 19. The contact pads 24 cover the upper surfaces of the second contact plugs 23. A material of the isolation barriers 21 includes silicon nitride.

The semiconductor layer 14 shown in FIG. 1A to FIG. 1C only covers the bottom surface and at least part of sidewalls of the groove 12. In another embodiment of the present disclosure, the semiconductor layer 14 further cover part of the upper surface of the substrate 10.

As shown in FIG. 2A to FIG. 2C, specifically, each semiconductor layer 14 includes a first sublayer 141, a second sublayer 142 and a third sublayer 143. The first sublayer 141 covers the bottom surface and sidewalls of the groove 12. The second sublayer 142 and the third sublayer 143 are located on two sides of the groove 12, and cover the upper surface of the substrate 10. In some embodiments, each semiconductor layer 14 includes two first sublayers 141, one second sublayer 142 and two third sublayers 143. The two third sublayers 143 are respectively located on two ends of the semiconductor layer 14. The second sublayer 142 is located in the intermediate area of the semiconductor layer 14. The second sublayer 142 and the third sublayers 143 are separated by the first sublayers 141, and two ends of each first sublayer 141 are respectively connected to the second sublayer 142 and the third sublayer 143.

In the embodiments of the present disclosure, the first sublayer 141 is disposed between the word line structure 15 and the substrate 10, while the second sublayer 142 and the third sublayer 143 are disposed on the substrate. The second sublayer 142, the first sublayer 141 and the third sublayer 143 may form a current transmission path, and materials of the first sublayer, the second sublayer 142 and the third sublayer 143 include the oxide semiconductor material. Since the oxide semiconductor material has higher carrier mobility and lower leakage current, leakage current such as GIDL can be effectively reduced, such that the on/off current ratio and current drivability of the transistor can be improved, thereby improving the capability of the word line structure 15 for driving the transistor, reducing power consumption, and improving the performance of the semiconductor structure.

In an embodiment, an orthographic projection of the semiconductor layer 14 on a plane of the substrate 10 at least partially overlaps with an orthographic projection of the active area AA on the plane of the substrate 10. In some embodiments, the first sublayer 141 at least covers part of the surface, which is exposed by the groove 12, of the active area AA. The second sublayer 142 at least covers part of upper surfaces of two end portions of the active area AA.

The third sublayer 143 at least covers part of the upper surface of the intermediate area of the active area AA.

In an embodiment, the first sublayer 141 has P-type doping, and the second sublayer 142 and the third sublayer 143 have N-type doping; alternatively, the first sublayer 141 has N-type doping, and the second sublayer 142 and the third sublayer 143 have P-type doping.

In an embodiment, the insulation layer 13 is located between the first sublayer 141 and the substrate 10. Therefore, channel leakage current and GIDL leakage current can be effectively reduced. As shown in FIG. 2B and FIG. 2C, in some embodiments, the insulation layer 13 covers the inner wall of the groove 12 and the surface of the substrate 10. That is to say, the insulation layer 13 is located among the second sublayer 142, the third sublayer 143 and the substrate 10, such that leakage current can be further reduced.

In this embodiment, the upper surface of the word line structure 15 is lower than the upper surfaces of the second sublayer 142 and the third sublayer 143. The word line cover layers 16 cover the word line structures 15 and are filled in the gaps among the plurality of second sublayers 142 and the plurality of third sublayers 143.

In an embodiment, the semiconductor structure further includes: a plurality of bit line structures 19, located on the substrate 10 and extending in the second direction that interacts with the first direction; and first contact plugs 18, located under the bit line structures 15 and above the second sublayers 142. The first contact plugs 18 are electrically connected to the bit line structures 19 and the second sublayers 142. Specifically, each bit line structure includes a bit line 191, a bit line cover layer 192 and a bit line sidewall layer 193. The bit line cover layer 192 covers an upper surface of the bit line 191. The bit line sidewall layer 193 covers the bit line cover layer 192, the bit line 191 and a sidewall of the first contact plug 18. In an embodiment, a material of the first contact plug 18 is TiN. Compared with the polysilicon mentioned in the related art, the TiN has better conductivity, such that the first contact plug 18 and the second sublayer 142 have smaller contact resistance. A material of the bit line 193 includes tungsten.

As shown in FIG. 1C, in an embodiment, the semiconductor structure further includes a dielectric layer 17. The dielectric layer 17 is located between the bit lines 191 and the substrate 10. The bit line sidewall layer 193 further cover a sidewall of the dielectric layer 17.

In an embodiment, the semiconductor structure further includes a plurality of second contact plugs 23 and a plurality of contact pads 24. The second contact plugs 23 are located under the contact pads 24, and are connected in contact to the third sublayers 143. In an embodiment, a material of the second contact plugs 23 is TiN. Compared with the polysilicon mentioned in the related art, the TiN has better conductivity, such that the second contact plugs 23 and the third sublayers 143 have smaller contact resistance. A material of the contact pads 24 includes tungsten.

In this embodiment, the first contact plugs 18 are in contact with the second sublayers 142 of the semiconductor layers 14, and the second contact plugs 23 are in contact with the third sublayers 143 of the semiconductor layers 14. The material of the semiconductor layers 14 includes the oxide semiconductor material. The oxide semiconductor material has higher carrier mobility and lower leakage currents. Compared with the embodiments that the first contact plugs 18 and the second contact plugs 23 are in direct contact with the active areas AA, leakage current and contact resistance are further reduced, thereby improving the performance of the semiconductor structure.

An embodiment of the disclosure further provides a method for manufacturing a semiconductor structure. As shown in FIG. 3, the method includes the following steps.

At S301, a substrate is provided.

At S302, grooves extending in a first direction are formed in the substrate.

At S303, semiconductor layers are formed. Each of the semiconductor layers at least partially covers an inner wall of a groove. A material of the semiconductor layers includes oxide semiconductor material.

At S304, word line structures are formed. A word line structure is located in the groove and at least cover part of the semiconductor layer.

The method for manufacturing a semiconductor structure provided in the embodiments of the present disclosure is further described in detail below with reference to FIG. 4 to FIG. 25.

First, the step in S301 is performed, as shown in FIG. 4, the substrate 10 is provided.

The substrate may be a semiconductor substrate, and may include at least one of an elementary semiconductor material (for example, a silicon (Si) substrate, or a germanium (Ge) substrate), at least one III-V compound semiconductor material, at least one II-VI compound semiconductor material, at least one organic semiconductor material, or other semiconductor materials known in the art. In a specific embodiment, the substrate is the Si substrate. The Si substrate may or may not be doped.

Figures 5, 6:
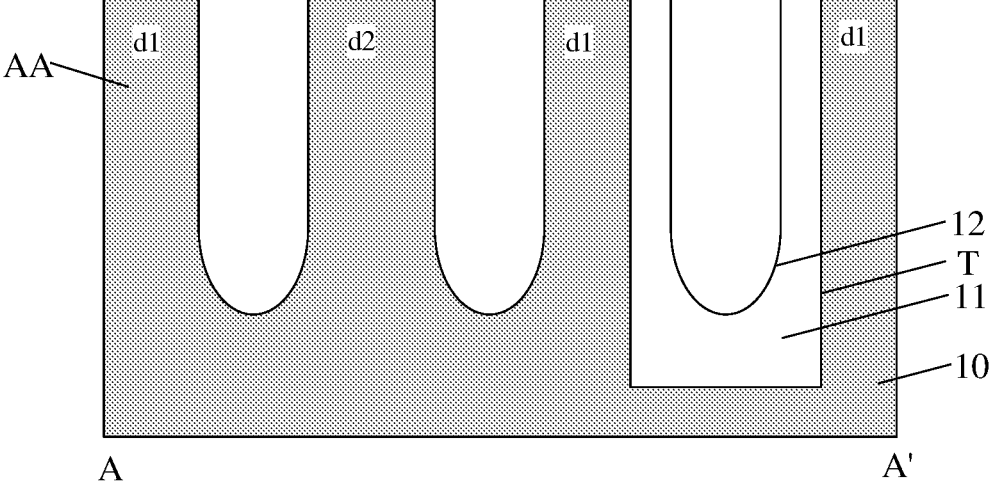
FIG. 5 is a schematic diagram of a cross-sectional structure, taken along the A-A' line of FIG. 1A, of another step of a method for manufacturing a semiconductor structure according to an embodiment of the present disclosure.
FIG. 6 is a schematic diagram of a cross-sectional structure, taken along the A-A' line of FIG. 1A, of another step of a method for manufacturing a semiconductor structure according to an embodiment of the present disclosure.

Next, the step in S302 is executed, as shown in FIG. 5, the grooves 12 extending in the first direction are formed in the substrate 10.

Specifically, the step of forming, in the substrate 10, the grooves 12 extending in the first direction includes the following operations.

The substrate 10 is etched to form isolation trenches T. The isolation trenches T separate the substrate 10 into a plurality of discrete active areas AA.

Filling layers are formed in the isolation trenches T, to form isolation structures 11.

The active areas AA and the isolation structures 11 are etched to form a plurality of grooves 12 extending in the first direction. Each active area AA is separated into an intermediate area and two end portions by the two adjacent grooves 12.

The plurality of active areas AA are arranged in parallel. The plurality of grooves 12 are arranged in the second direction that interacts with the first direction. Each groove 12 penetrates the active area AA and the isolation structure 11 and exposes the active area AA and the isolation structure 11. The material of the isolation structure 11 may include one or more of oxides (such as silicon oxide), nitrides (such as silicon nitride) and nitrogen oxides (such as silicon nitride). In some embodiments, the first direction is perpendicular to the second direction. However, it is not limited herein, the first direction may also obliquely interact with the second direction.

In an embodiment, the method further includes: performing a doping process on the active area AA, to form first source/drain doped areas d1 on two ends of the active area AA, and to form a second source/drain doped area d2 in the intermediate area of the active area AA. The first source/drain doped areas d1 and the second source/drain doped area d2 are separated by the groove 12. The doping types of the first source/drain doped areas d1 and the second source/drain doped area d2 may be the same; and the doping types of the first source/drain doped areas d1 and the second source/drain doped area d2 may be different from the doping type of the substrate 10.

Figure 8:
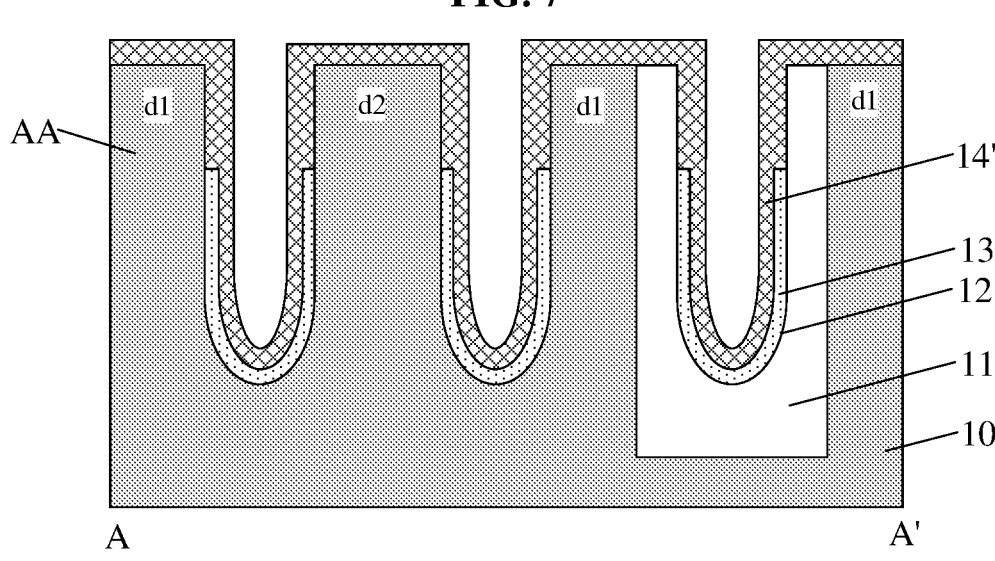
FIG. 8 is a schematic diagram of a cross-sectional structure, taken along the A-A' line of FIG. 1A, of another step of a method for manufacturing a semiconductor structure according to an embodiment of the present disclosure.
Figures 9, 10:
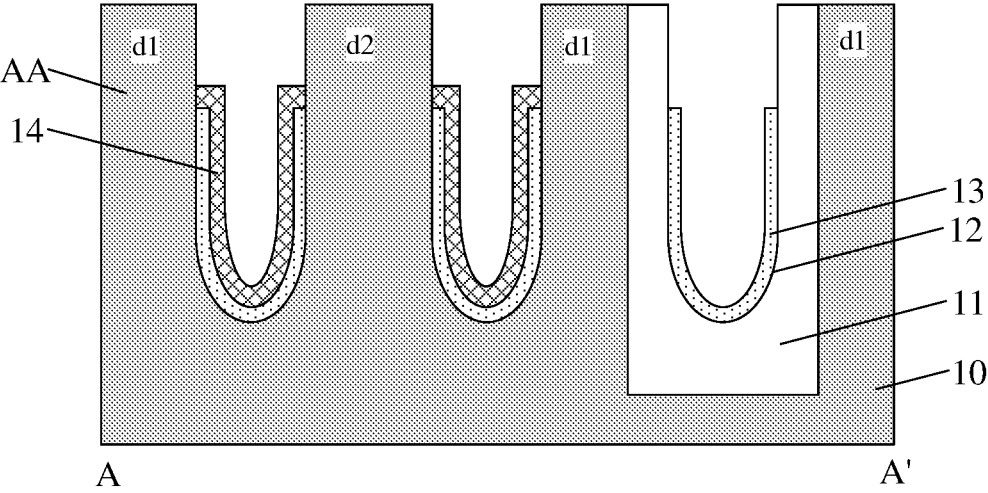
FIG. 9 is a schematic diagram of a cross-sectional structure, taken along the A-A' line of FIG. 1A, of another step of a method for manufacturing a semiconductor structure according to an embodiment of the present disclosure.
FIG. 10 is a schematic diagram of a cross-sectional structure, taken along the A-A' line of FIG. 1A, of another step of a method for manufacturing a semiconductor structure according to an embodiment of the present disclosure.

Next, the step in S303 is executed, as shown in FIG. 8 to FIG. 9, the semiconductor layers 14 are formed. Each of the semiconductor layers 14 at least partially covers an inner wall of the groove 12. A material of the semiconductor layers 14 includes oxide semiconductor material.

Specifically, the operation of forming the semiconductor layers 14, each the semiconductor layers 14 at least partially covering the sidewall of the groove 12 includes the following operations.

A semiconductor material layer 14' is formed. The semiconductor material layer 14' covers the inner walls of the grooves 12 and an upper surface of the substrate 10, as shown in FIG. 8.

The semiconductor material layer 14' covering the upper surface of the substrate 10 is removed; and the semiconductor material layer 14' remained on the inner walls of the grooves 12 is etched, to form a plurality of discrete semiconductor layers 14. Each semiconductor layer 14 covers the sidewall and bottom surface of the groove 12, and a projection of each semiconductor layer 14 on a plane of the substrate 10 at least partially overlaps with a projection of the active area AA on the plane of the substrate 10.

The semiconductor layer 14 covers at least part of a surface of the active area AA exposed by the groove 12. The first source/drain doped area d1 and the second source/drain doped area d2 are respectively located on two sides of the semiconductor layer 14 and are in contact with the semiconductor layer 14. An upper surface of the semiconductor layer 14 is lower than the upper surface of the substrate 10; or the upper surface of the semiconductor layer 14 is flush with the upper surface of the substrate 10. The oxide semiconductor material layer may be formed by sputtering, coating, printing, vapor deposition, PCVD, PLD, ALD, or MBE.

In an embodiment, the oxide semiconductor material includes $In_xGa_yZn_{1-x-y}O$, where x is greater than or equal to 0 or is less than or equal to 1, and y is greater than or equal to 0 or is less than or equal to 1, for example, a material with a chemical formula $In_{0.2}Ga_{0.3}Zn_{0.5}O$. However, the material is not limited thereto, the oxide semiconductor material also includes at least one of indium oxide, tin oxide, In—Zn oxides, Sn—Zn oxides, Al—Zn oxides, In—Ga oxides, In—Al—Zn oxides, In—Sn—Zn oxides, Sn—Ga—Zn oxides, Al—Ga—Zn oxides, or Sn—Al—Zn oxides.

However, the material is not limited thereto, the oxide semiconductor material may also include at least one of In—Hf—Zn oxides, In—La—Zn oxides, In—Ce—Zn oxides, In—Pr—Zn oxides, In—Nd—Zn oxides, In—Sm—Zn oxides, In—Eu—Zn oxides, In—Gd—Zn oxides, In—Tb—Zn oxides, In—Dy—Zn oxides, In—Ho—Zn oxides, In—Er—Zn oxides, In—Tm—Zn oxides, In—Yb—Zn oxides, In—Lu—Zn oxides, and quaternary metal oxides such as In—Sn—Ga—Zn oxides, In—Hf—Ga—Zn oxides, In—Al—Ga—Zn oxides, In—Sn—Al—Zn oxides, In—Sn—Hf—Zn oxides, or In—Hf—Al—Zn oxides.

Optionally, the oxide semiconductor material may be an undoped oxide semiconductor material, or a doped oxide semiconductor material. Specifically, a doping agent for doping the oxide semiconductor material includes more than one of boron, nitrogen, phosphorus and arsenic, or more than one of helium, neon, argon, krypton, and xenon. Alternatively, the doping agent is hydrogen, but is not limited thereto, and the doping agent may also be any combination of the above materials according to requirements.

In an embodiment, the semiconductor layer 14 has P-type doping. But the semiconductor layer is not limited thereto, the semiconductor layer 14 may also have N-type doping. It is to be understood that, when the semiconductor layer 14 has P-type doping, the first source/drain doped area d1 and the second source/drain doped area d2 have N-type doping; on the contrary, when the semiconductor layer 14 has N-type doping, the first source/drain doped area d1 and the second source/drain doped area d2 have P-type doping.

Figure 7:
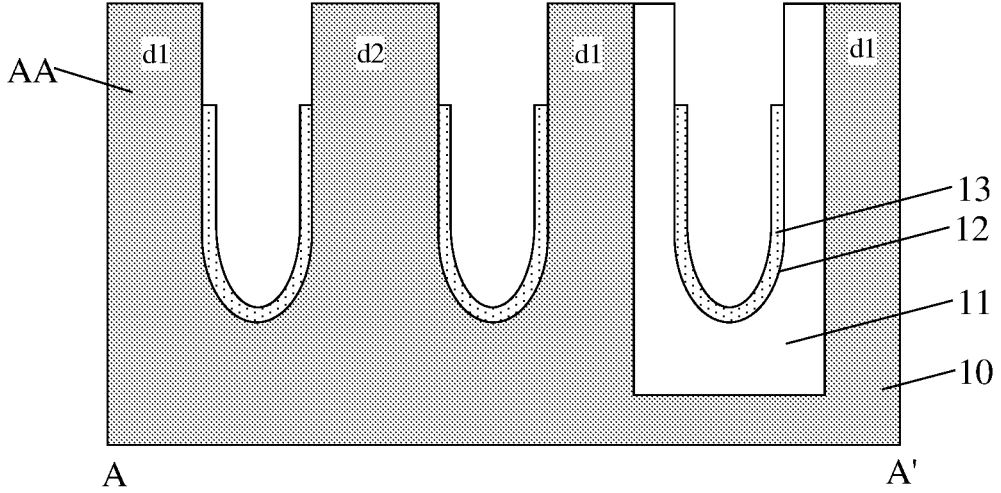
FIG. 7 is a schematic diagram of a cross-sectional structure, taken along the A-A' line of FIG. 1A, of another step of a method for manufacturing a semiconductor structure according to an embodiment of the present disclosure.

As shown in FIG. 6 to FIG. 7, in an embodiment, before the semiconductor layer 14 is formed, the method further includes the following operations.

An insulation layer 13 is formed. The insulation layer 13 covers the inner walls of the grooves 12 and the upper surface of the substrate 10.

The insulation layer 13 located on the upper surface of the substrate 10 is removed, and the remaining insulation layers 13 covering the sidewalls of the grooves 12 are etched, to enable upper surfaces of the insulation layers 13 located on the sidewalls of the grooves 12 to be lower than the upper surface of the substrate 10.

Referring to FIG. 9 again, the semiconductor layer 14 covers the insulation layer 13 and at least part of an area of the sidewall of the groove 12 that is not covered by the insulation layer 13. In the embodiments of the present disclosure, by disposing the insulation layers 13 between the substrate 10 and the semiconductor layers 14, channel leakage current and GIDL leakage current can be effectively reduced. A material of the insulation layers 13 includes oxide such as silicon oxide. The insulation layers 13 may be formed by means of a thermal oxidation process, such as a wet oxidation process of furnace or an In-Situ Steam Generation (ISSG) process. It is to be understood that, when the insulation layers 13 may be formed by means of the thermal oxidation process, the insulation layers 13 cover at least part of the surfaces of the active areas AA exposed by the grooves 12. But the insulation layers are not limited thereto, the insulation layers 13 may also be formed by means of a Chemical Vapor Deposition (CVD) process.

Next, the operation in S304 is executed. As shown in FIG. 10, word line structures 15 are formed. The word line structures 15 are located in the grooves 12 and at least cover part of the semiconductor layers 14.

Specifically, there are a plurality of word line structures 15, and the plurality of word line structures 15 are arranged in the second direction. In some embodiments, each word line structure 15 includes a conductive layer 152 and a gate dielectric layer 151 interposed between the conductive layer 152 and the semiconductor layer 14. A material of the conductive layers 152 includes tungsten (W), copper (Cu), titanium (Ti), tantalum (Ta), titanium nitride (TiN), tantalum nitride (TaN), metal silicides, metal alloys, or any combination thereof, for example, Titanium Nitride (TiN). A material of the gate dielectric layers 151 may be a high dielectric constant material, for example, may be tantalum oxide, hafnium oxide, zirconium oxide, niobium oxide, titanium oxide, barium oxide, strontium oxide, yttrium oxide, lanthanum oxide, praseodymium oxide, or barium strontium titanate. In the embodiments of the present disclosure, a high dielectric constant material is used as the material of the gate dielectric layers 151, such that the current drivability of the transistor can be further improved.

Referring to FIG. 10 again, in an embodiment, upper surfaces of the word line structures 15 are lower than the upper surface of the substrate 10. The method further includes: word line cover layers 16 are formed. The word line cover layers 16 cover the word line structures 15.

Figure 11:
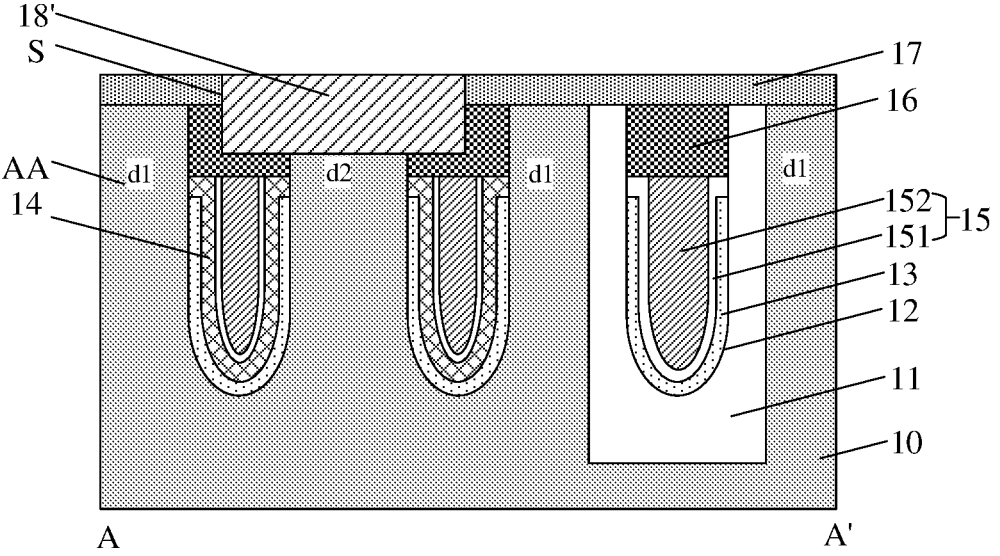
FIG. 11 is a schematic diagram of a cross-sectional structure, taken along the A-A' line of FIG. 1A, of another step of a method for manufacturing a semiconductor structure according to an embodiment of the present disclosure.

Next, as shown in FIG. 11, the method further includes the following operations.

A dielectric layer 17 is formed on the substrate 10.

Part of the dielectric layer 17 and part of the second source/drain doped areas d2 located under part of the dielectric layer 17 and part of word line cover layers 16 are removed, so as to form trenches S.

Initial first contact plugs 18' are formed in the trenches S, and in contact with the first source/drain doped areas d1.

Figure 12:
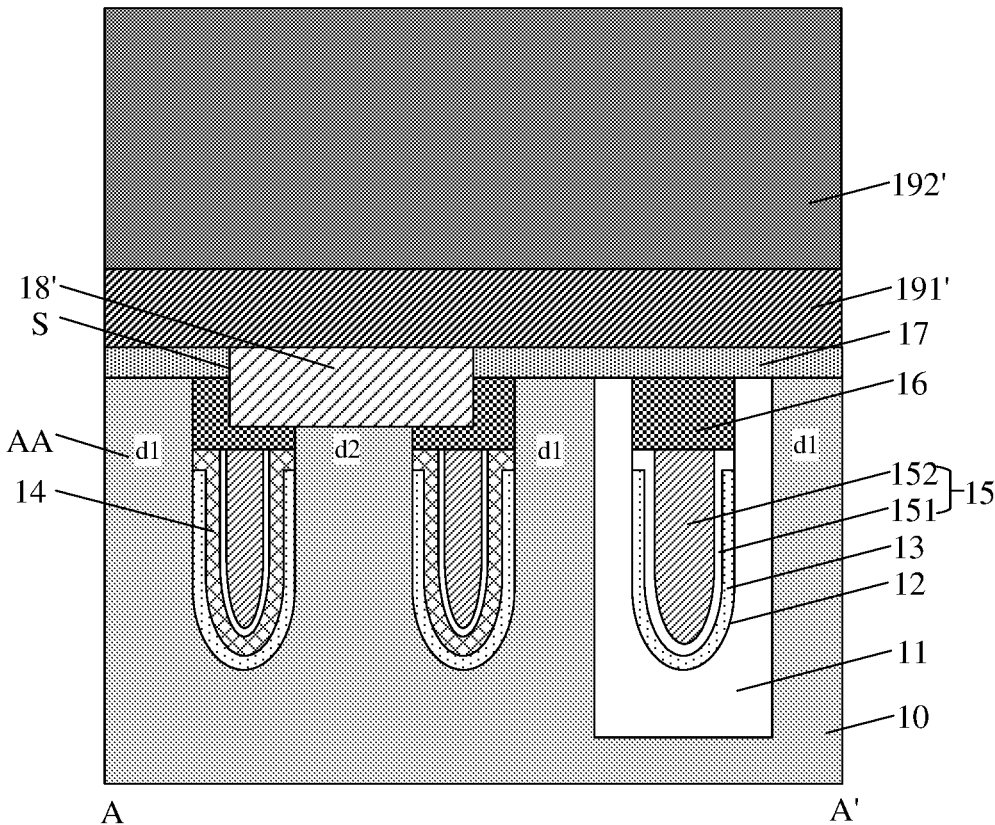
FIG. 12 is a schematic diagram of a cross-sectional structure, taken along the A-A' line of FIG. 1A, of another step of a method for manufacturing a semiconductor structure according to an embodiment of the present disclosure.
Figure 13:
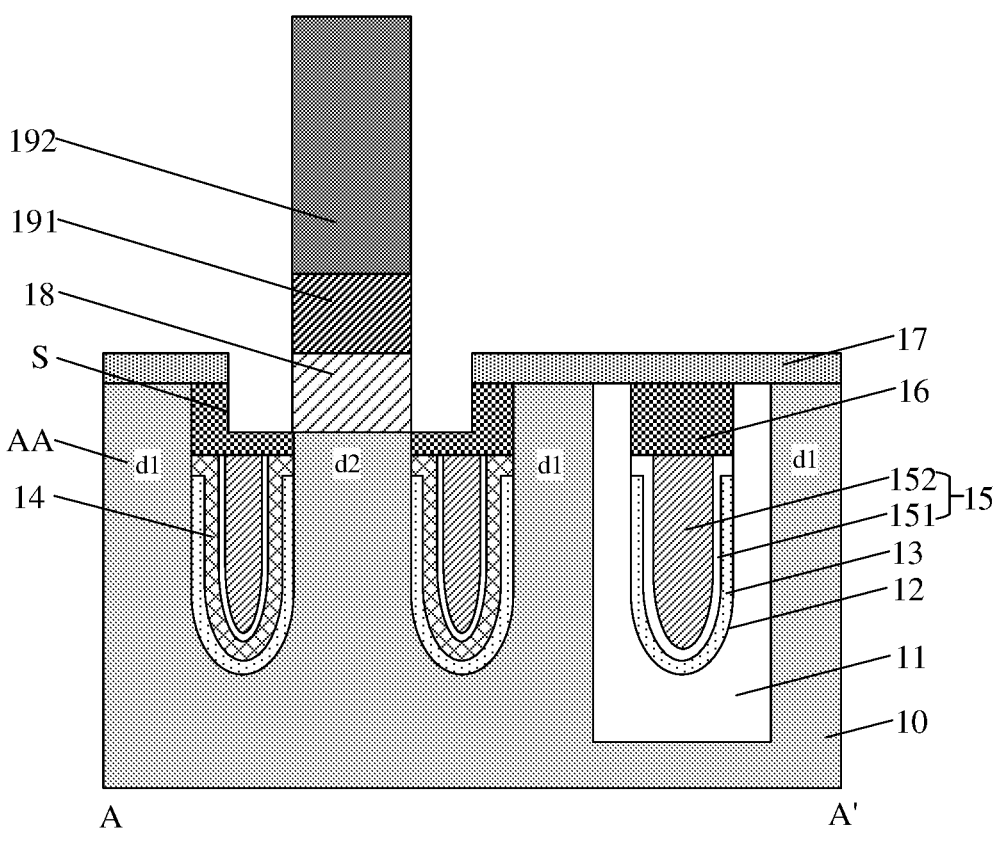
FIG. 13 is a schematic diagram of a cross-sectional structure, taken along the A-A' line of FIG. 1A, of another step of a method for manufacturing a semiconductor structure according to an embodiment of the present disclosure.
Figure 14:
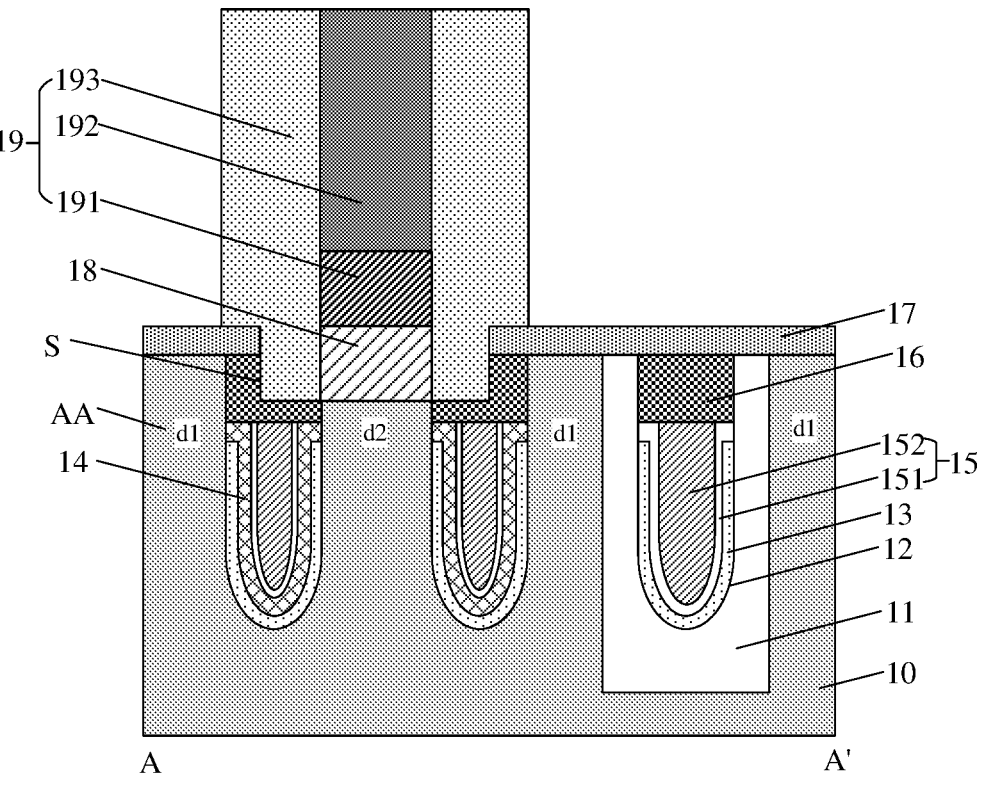
FIG. 14 is a schematic diagram of a cross-sectional structure, taken along the A-A' line of FIG. 1A, of another step of a method for manufacturing a semiconductor structure according to an embodiment of the present disclosure.
Figures 15, 16:
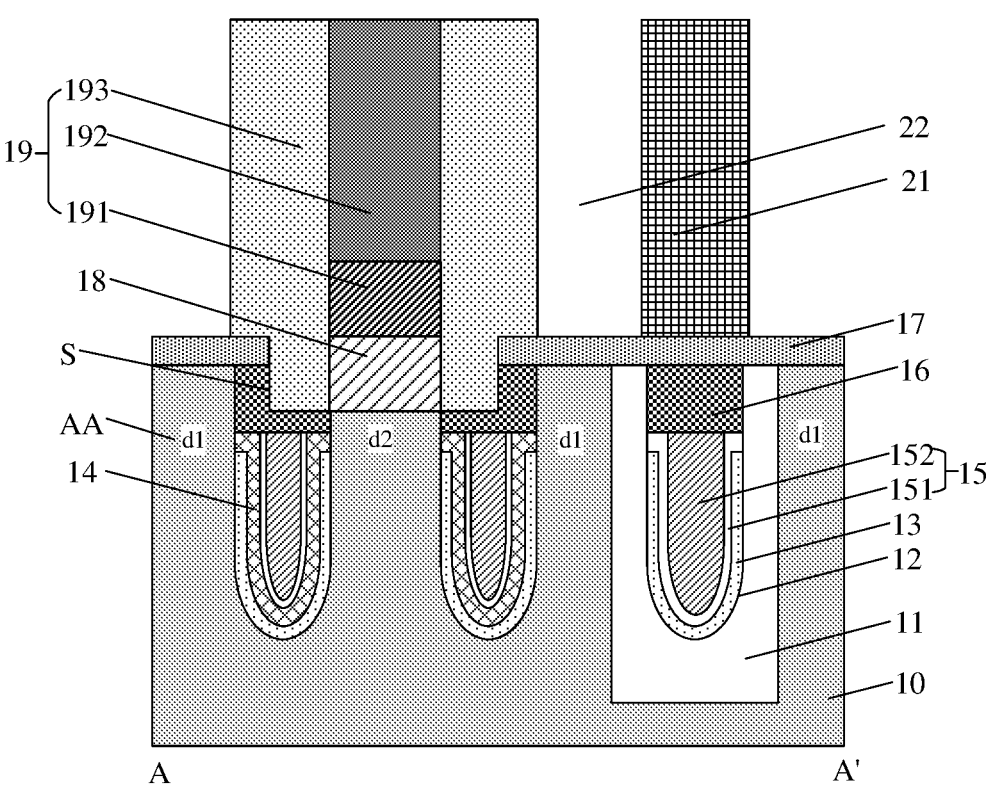
FIG. 15 is a schematic diagram of a cross-sectional structure, taken along the A-A' line of FIG. 1A, of another step of a method for manufacturing a semiconductor structure according to an embodiment of the present disclosure.
FIG. 16 is a schematic diagram of a cross-sectional structure, taken along the A-A' line of FIG. 1A, of another step of a method for manufacturing a semiconductor structure according to an embodiment of the present disclosure.

Next, as shown in FIG. 12 to FIG. 14, the method further includes the following operations.

A bit line material layer 191' is formed on the substrate 10, and is connected in contact to the initial first contact plugs 18'; and an insulation material layer 192' is formed on the bit line material layer 191'.

The insulation material layer 192' is etched to form bit line cover layers 192; the bit line material layer 191' is etched to form bit lines 191; and the initial first contact plugs 18' are etched to form first contact plugs 18. There are gaps between the first contact plugs 18 and the substrate 10 as well as the dielectric layer 17. The bit line cover layers 192 and the bit lines 191 extend in the second direction and are arranged in the first direction.

Bit line sidewall layers 193 are formed. The bit line sidewall layers 193 cover the bit line cover layers 192, the bit lines 191 and sidewalls of the first contact plugs 18, and are filled in the gaps. The bit lines 191, the bit line cover layers 192 and the bit line sidewall layers 193 form a plurality of bit line structures 19 that extend in the second direction and are arranged in the first direction.

A material of the first contact plugs 18 includes polysilicon. The bit lines 191 include TiN layers and W layers located on the TiN layers. Materials of the bit line cover layers 192 and the bit line sidewall layers 193 include silicon nitride.

Next, as shown in FIG. 15 to FIG. 17, and FIG. 1B to FIG. 1C, the method further includes the following operations.

A plurality of isolation barriers 21 that extend in the first direction and are arranged in the second direction are formed. The plurality of isolation barriers 21 and the plurality of bit line structures 19 enclose a plurality of openings 22.

Parts of the dielectric layer 17 in the openings 22 and parts of the substrate 10 under parts of the dielectric layer 17 are removed. The first source/drain doped areas d1 are exposed from the openings 22.

Second contact plugs 23 are formed in the openings 22. The second contact plugs 23 are connected to the first source/drain doped areas d1.

Figures 17, 18:
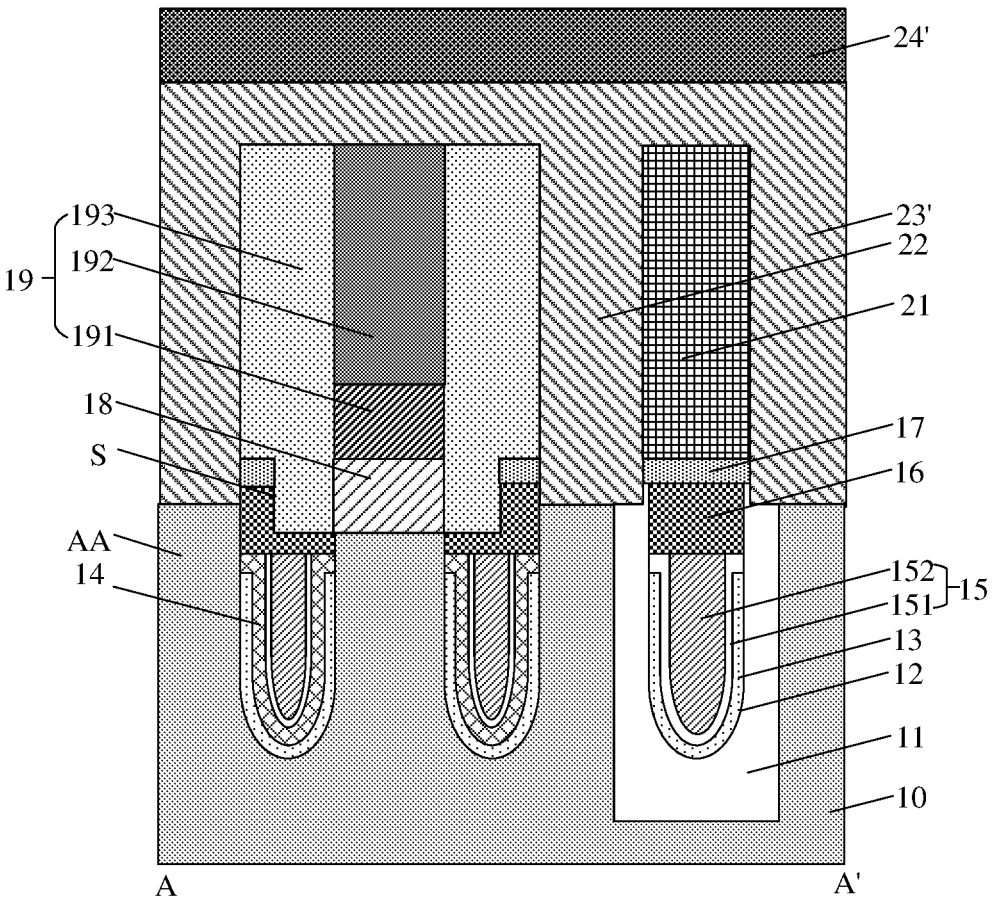
FIG. 17 is a schematic diagram of a cross-sectional structure, taken along the A-A' line of FIG. 2A, of a step of a method for manufacturing a semiconductor structure according to another embodiment of the present disclosure.
FIG. 18 is a schematic diagram of a cross-sectional structure, taken along the A-A' line of FIG. 2A, of another step of a method for manufacturing a semiconductor structure according to another embodiment of the present disclosure.

Referring to FIG. 17, FIG. 1B to FIG. 1C again, the method further includes that contact pads 24 are formed. Specifically, the operation of forming the second contact plugs 23 and the contact pads 24 includes the following operations.

A second contact plug material layer 23' is formed on the substrate 10, and covers the openings 22, the bit line structures 19 and the isolation barriers 21; and a contact pad material layer 24' is formed on the second contact plug material layer 23'.

The second contact plug material layer 23' and the contact pad material layer 24' are etched to form a plurality of second contact plugs 23 and a plurality of contact pads 24. The second contact plugs 23 are at least partially located in the openings 22. The second contact plugs 23 also cover part of tops and part of sidewalls of the bit line structures 19. The contact pads 24 cover the upper surfaces of the second contact plugs 23.

In an embodiment, a material of the second contact plugs 23 is TiN. Compared with the polysilicon mentioned in the related art, the TiN has better conductivity, such that the second contact plugs 23 and the first source/drain doped area d1 have smaller contact resistance. However, the material is not limited thereto, the material of the second contact plugs 23 may also be other materials with good conductivity, for example, tungsten, tungsten nitride, titanium, and the like. A material of the contact pads 24 includes tungsten. A material of the isolation barriers 21 includes silicon nitride.

It can be seen that, in the embodiments of the present disclosure, the semiconductor layer 14 is disposed between the word line structure 15 and the substrate 10, the material of the semiconductor layer 14 includes the oxide semiconductor material, and the oxide semiconductor material may act as a channel for transmitting charges. Since the oxide semiconductor material has higher carrier mobility and lower leakage current, GIDL leakage current can be effectively alleviated or eliminated, such that the on/off current ratio and current drivability of a transistor can be improved, thereby improving the capability of the word line structure 15 for driving the transistor, reducing power consumption, and improving the performance of the semiconductor structure.

Each of the semiconductor layers 14 shown in FIG. 4 to FIG. 17 only covers the bottom surface and at least part of sidewalls of the groove 12. In another embodiment of the present disclosure, the semiconductor layers 14 also cover parts of the upper surface of the substrate 10, as shown in FIG. 18 to FIG. 25.

Figure 19:
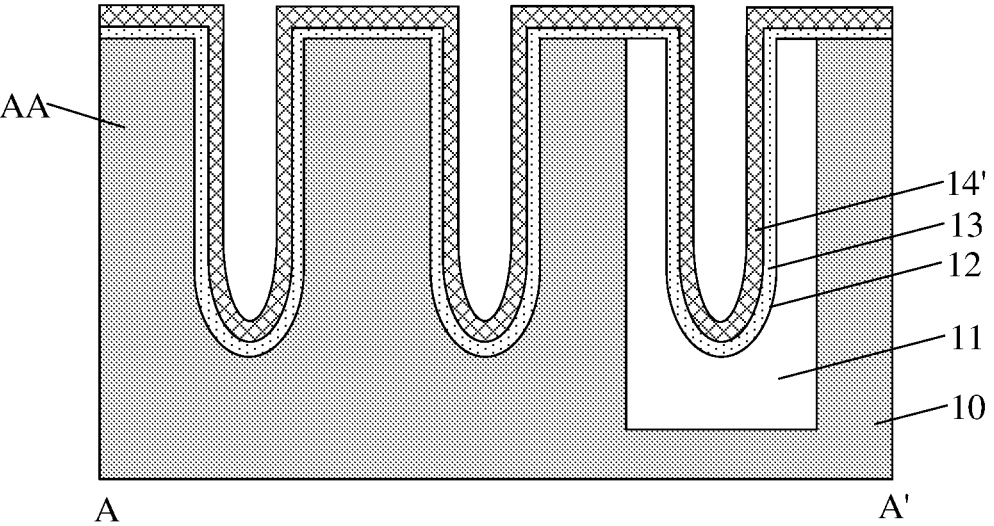
FIG. 19 is a schematic diagram of a cross-sectional structure, taken along the A-A' line of FIG. 2A, of another step of a method for manufacturing a semiconductor structure according to another embodiment of the present disclosure.
Figure 20:
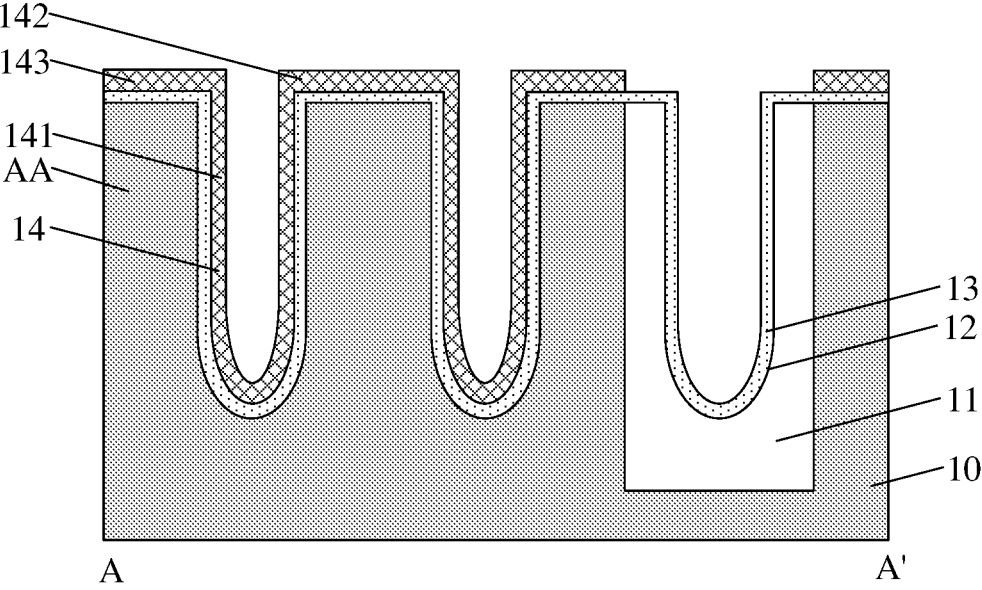
FIG. 20 is a schematic diagram of a cross-sectional structure, taken along the A-A' line of FIG. 2A, of another step of a method for manufacturing a semiconductor structure according to another embodiment of the present disclosure.

As shown in FIG. 19 to FIG. 20, specifically, the operation that the semiconductor layers 14 are formed, and each of the semiconductor layers 14 at least partially covers the sidewalls of the groove 12 includes the following operations.

A semiconductor material layer 14' is formed. The semiconductor material layer 14' covers the inner walls of the grooves 12 and the upper surface of the substrate 10.

The semiconductor material layer 14' is etched to form a plurality of discrete semiconductor layers 14. Projections of the semiconductor layers 14 on a plane of the substrate 10 at least partially overlap with projections of the active areas AA on the plane of the substrate 10. Each semiconductor layer 14 includes a first sublayer 141, a second sublayer 142 and a third sublayer 143. The first sublayer 141 covers the bottom surface and sidewalls of the groove 12. The second sublayer 142 and the third sublayer 143 are located on two sides of the groove 12 and cover the upper surface of the active area AA.

In some embodiments, the first sublayer 141 at least covers part of the surface of the active area AA exposed by the groove 12. The second sublayer 142 at least covers part of the upper surface of the intermediate area of the active area AA. The third sublayer 143 at least covers part of upper surfaces of the two end portions of the active area AA.

In an embodiment, the first sublayer 141 has P-type doping, and the second sublayer 142 and the third sublayer 143 have N-type doping; alternatively, the first sublayer 141 has N-type doping, and the second sublayer 142 and the third sublayer 143 have P-type doping.

As shown in FIG. 18, in an embodiment, before the semiconductor layer 14 is formed, the method further includes: an insulation layer 13 is formed. The insulation layer 13 covers the inner walls of the grooves 12 and the upper surface of the substrate 10. Therefore, channel leakage current and GIDL leakage current can be effectively reduced.

Figure 21:
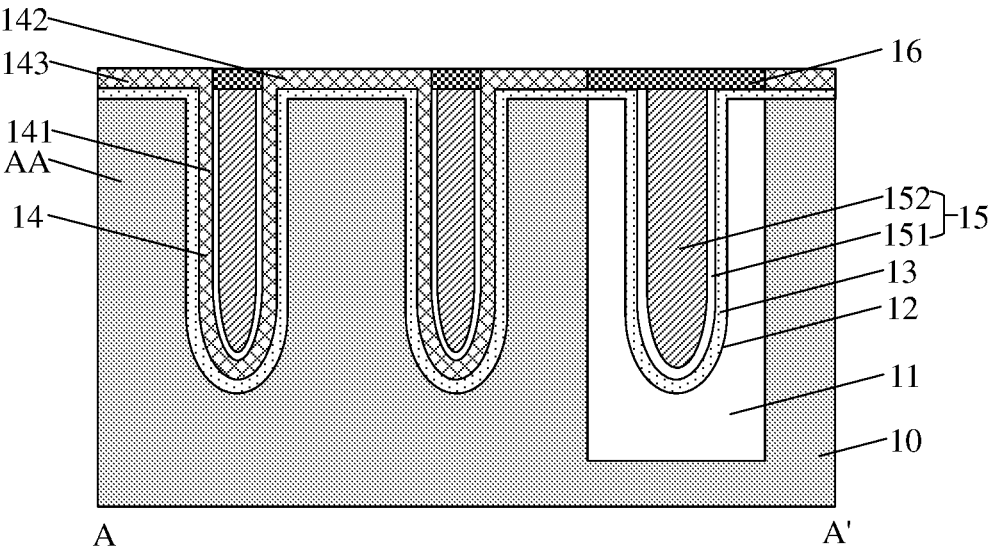
FIG. 21 is a schematic diagram of a cross-sectional structure, taken along the A-A' line of FIG. 2A, of another step of a method for manufacturing a semiconductor structure according to another embodiment of the present disclosure.

Next, as shown in FIG. 21, word line structures 15 are formed in the grooves 12, and the upper surfaces of the word line structures 15 are lower than the upper surfaces of the semiconductor layers 14; and word line cover layers 16 are formed. The word line cover layers 16 cover the word line structures 15 and are filled in the gaps among the plurality of second sublayers 142 and the plurality of third sublayers 143.

Figure 22:
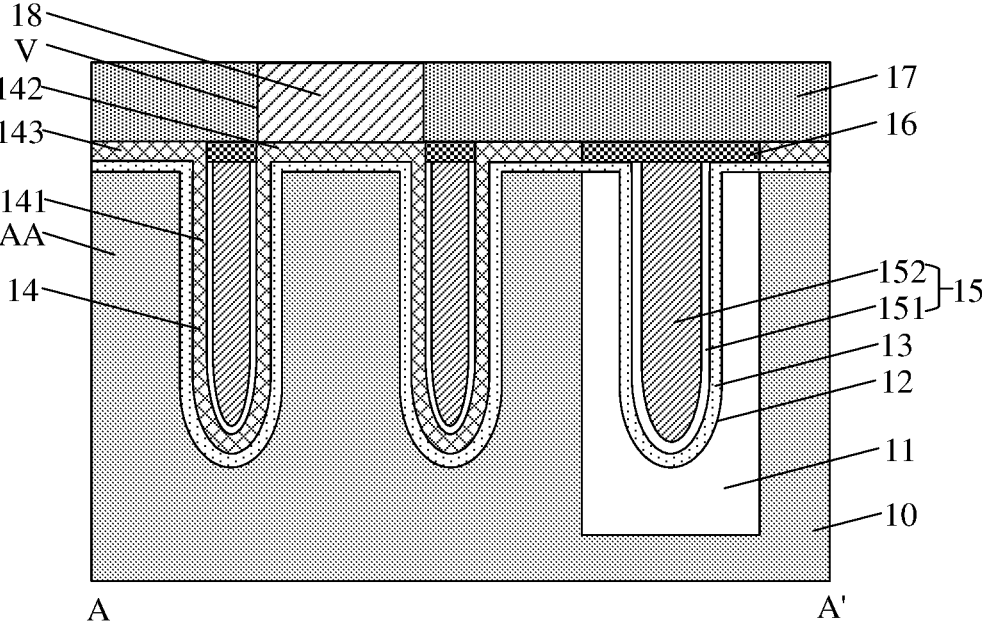
FIG. 22 is a schematic diagram of a cross-sectional structure, taken along the A-A' line of FIG. 2A, of another step of a method for manufacturing a semiconductor structure according to another embodiment of the present disclosure.
Figure 23:
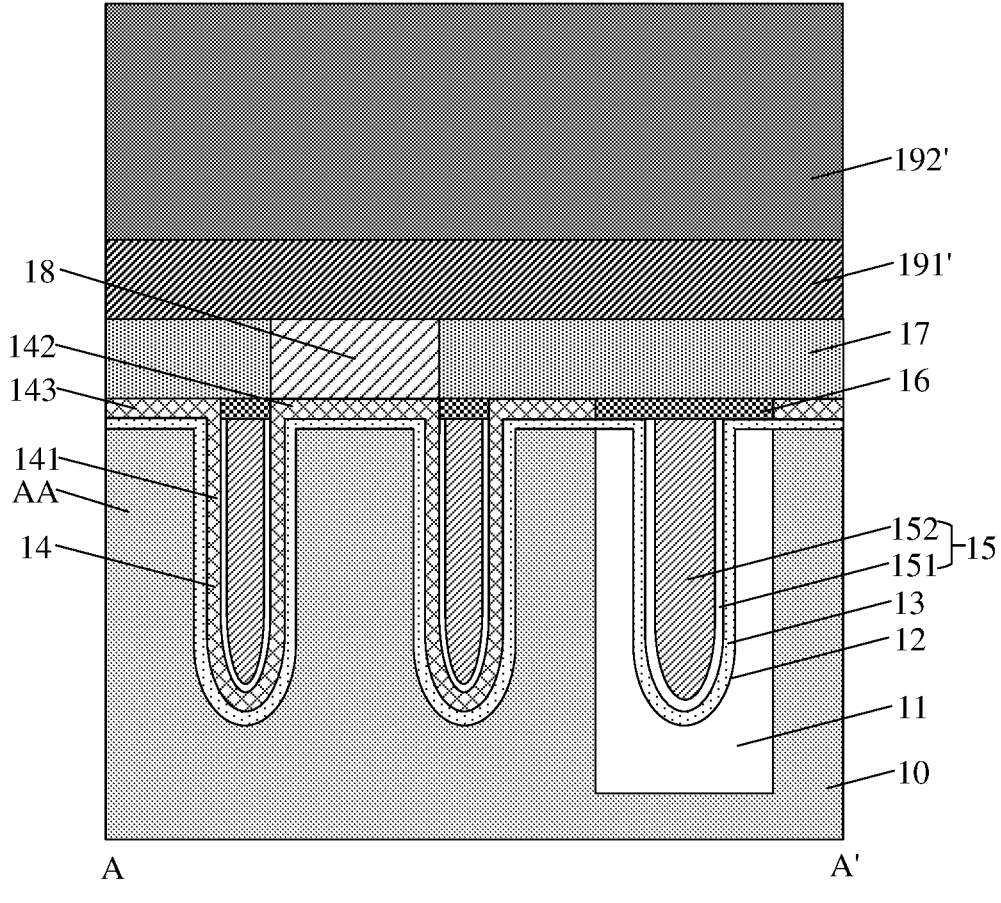
FIG. 23 is a schematic diagram of a cross-sectional structure, taken along the A-A' line of FIG. 2A, of another step of a method for manufacturing a semiconductor structure according to another embodiment of the present disclosure.
Figure 24:
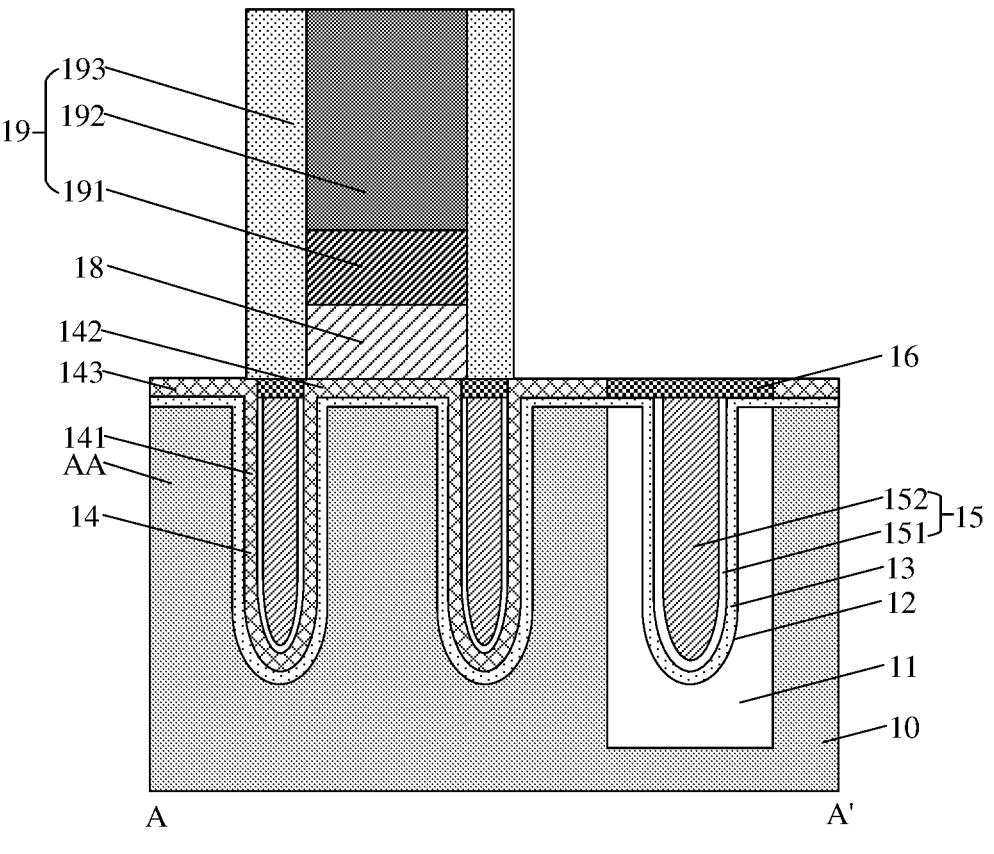
FIG. 24 is a schematic diagram of a cross-sectional structure, taken along the A-A' line of FIG. 2A, of another step of a method for manufacturing a semiconductor structure according to another embodiment of the present disclosure.

Next, as shown in FIG. 22 to FIG. 24, after the word line structures 15 are formed, the method further includes the following operations.

A dielectric layer 17 is formed. The dielectric layer 17 is etched to form first contacts V, and the first contacts V exposes the second sublayers 142. First contact plugs 18 are formed in the first contacts V. The first contact plugs 18 are in contact with the second sublayers 142.

A plurality of bit line structures 19 extending in the second direction are formed. The bit line structures 19 are in electrical contact with the top of the first contact plugs 18.

Referring to FIG. 23 to FIG. 24 again, the operation that the bit line structures 19 are formed includes the following operations.

A bit line material layers 191' is formed on the substrate 10, and connected in contact to the first contact plugs 18. An insulation material layer 192' is formed on the bit line material layer 191'.

The insulation material layer 192' is etched to form a plurality of bit line cover layers 192; the bit line material layer 191' is etched to form a plurality of bit lines 191 extending in the second direction; and the dielectric layer 17 among the plurality of bit lines 191 is removed. The plurality of bit lines 191 and the plurality of bit line cover layers 192 extend in the second direction, and are arranged in the first direction.

Bit line sidewall layers 193 are formed. The bit line sidewall layers 193 cover the bit line cover layers 192, the bit lines 191 and sidewalls of the first contact plugs 18. The bit lines 191, the bit line cover layers 192 and the bit line sidewall layers 193 form bit line structures 19.

In an embodiment, a material of the first contact plugs 18 is TiN. Compared with the polysilicon mentioned in the related art, the TiN has better conductivity, such that the first contact plugs 18 and the second sublayers 142 have smaller contact resistance. However, the material is not limited thereto, the material of the first contact plugs 18 may also be other materials with good conductivity, for example, tungsten, tungsten nitride, titanium, and the like. A material of the bit lines 191 includes tungsten, copper, titanium, tantalum, titanium nitride, tantalum nitride, metal silicides, metal alloys, or any combination thereof.

Figure 25:
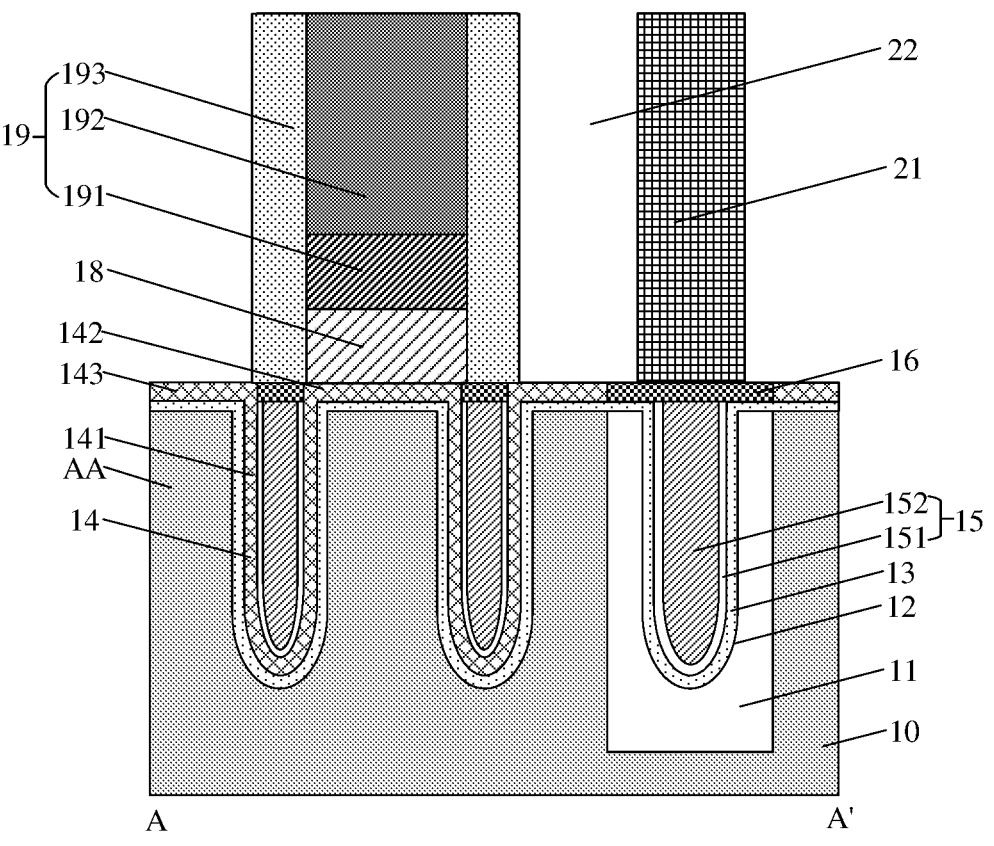
FIG. 25 is a schematic diagram of a cross-sectional structure, taken along the A-A' line of FIG. 2A, of another step of a method for manufacturing a semiconductor structure according to another embodiment of the present disclosure.

Next, referring to FIG. 25 and FIG. 2B to FIG. 2C, after the bit line structures 19 are formed, the method further includes the following operations.

A plurality of isolation barriers 21 extending in the first direction are formed. The plurality of isolation barriers 21 and the plurality of bit line structures 19 enclose a plurality of openings 22. The third sublayers 143 are exposed from the openings 22.

Second contact plugs 23 are formed in the openings 22. The second contact plugs 23 are in contact with the third sublayers 143.

The method further includes forming contact pads 24. A method for forming the contact pads 24 and the second contact plugs 23 is the same as that in the foregoing embodiments, which is not elaborated herein.

In an embodiment, a material of the second contact plugs 23 is TiN. Compared with the polysilicon mentioned in the related art, the TiN has better conductivity, such that the second contact plugs 23 and the third sublayers 143 have smaller contact resistance. However, the material is not limited thereto, and the material of the second contact plugs 23 may also be other materials with good conductivity, for example, tungsten, tungsten nitride, titanium, and the like. A material of the bit lines 191 includes tungsten, copper, titanium, tantalum, titanium nitride, tantalum nitride, metal silicides, metal alloys, or any combination thereof.

In this embodiment, the first contact plugs 18 are in contact with the second sublayers 142 of the semiconductor layers 14. The second contact plugs 23 are in contact with the third sublayers 143 of the semiconductor layers 14. The material of the semiconductor layers 14 includes the oxide semiconductor material. The oxide semiconductor material has higher carrier mobility and lower leakage current. Compared with the embodiments that the first contact plugs 18 and the second contact plugs 23 are in direct contact with the active areas AA, leakage current and contact resistance are further reduced, thereby improving the performance of the semiconductor structure.

It is to be noted that, the sequence of the above steps can be changed by those skilled in the art without departing from the protection scope of the disclosure. The above is only optional embodiments of the disclosure, and not intended to limit the scope of protection of the disclosure. Any modifications, equivalent replacements and improvements and the like made within the spirit and principle of the disclosure shall be within the scope of protection of the disclosure.

The invention claimed is:

1. A semiconductor structure, comprising:
   a substrate;
   a plurality of grooves, located in the substrate and extending in a first direction;
   a plurality of word line structures, located in the grooves; and
   a plurality of semiconductor layers, each semiconductor layer being at least partially located between a word line structure and an inner wall of a groove, wherein the semiconductor layer comprises oxide semiconductor material;
   wherein the substrate comprises isolation structures and a plurality of discrete active areas separated by the isolation structures, an extending direction of the active areas interacts with the first direction, two adjacent grooves separate an active area into two end portions and an intermediate area, and the active area is exposed by the grooves, wherein an orthographic projection of the semiconductor layer on a plane of the substrate at least partially overlaps with an orthographic projection of the active area on the plane of the substrate.

2. The semiconductor structure of claim 1, wherein the oxide semiconductor material comprises InxGayZn1-x-yO, x being greater than or equal to 0 or is less than or equal to 1, and y being greater than or equal to 0 or is less than or equal to 1.

3. The semiconductor structure of claim 1, further comprising:
   insulation layers, wherein an insulation layer is at least located between the substrate and the semiconductor layer.

4. The semiconductor structure of claim 3, wherein the insulation layer covers a bottom surface and part of sidewalls of the groove, and an upper surface of the insulation layer located on the sidewalls is lower than an upper surface of the substrate; and the semiconductor layer covers the insulation layer and areas of the sidewalls of the groove that are not covered by the insulation layer, and is in contact with exposed areas.

5. The semiconductor structure of claim 1, wherein the semiconductor layer comprises a first sublayer, a second sublayer and a third sublayer, the first sublayer covers a bottom surface and sidewalls of the groove, the second sublayer and the third sublayer are located on two sides of the groove, and cover part of an upper surface of the substrate.

6. The semiconductor structure of claim 5, further comprising:
   a plurality of bit line structures, located on the substrate and extending in a second direction that interacts with the first direction; and
   first contact plugs, each located under a bit line structure and above the second sublayer, wherein the first contact plug is electrically connected to the bit line structure and the second sublayer.

7. The semiconductor structure of claim 6, wherein each of the bit line structures comprises a bit line, a bit line cover layer and bit line sidewall layers, the bit line cover layer covers an upper surface of the bit line, and the bit line sidewall layers cover the bit line cover layer, the bit line and sidewalls of the first contact plugs.

8. The semiconductor structure of claim 5, further comprising:
   a plurality of second contact plugs and a plurality of contact pads, wherein the second contact plugs are located under the contact pads, and are connected to third sublayers.

9. A method for manufacturing a semiconductor structure, comprising:
   providing a substrate;
   etching the substrate to form isolation trenches, wherein the isolation trenches separate the substrate into a plurality of discrete active areas;
   forming filling layers in the isolation trenches, to form isolation structures;
   etching the active areas and the isolation structures to form a plurality of grooves extending in the first direction, wherein each of the active areas is separated into an intermediate area and two end portions by two adjacent grooves;
   forming a semiconductor material layer, wherein the semiconductor material layer covers inner walls of the grooves and an upper surface of the substrate;
   removing the semiconductor material layer covering the upper surface of the substrate;
   etching the semiconductor material layer remained on the inner walls of the grooves, to form a plurality of discrete semiconductor layers, wherein each of the semiconductor layers covers sidewalls and a bottom surface of the groove, and a projection of the semiconductor layer on a plane of the substrate at least partially overlaps with a projection of an active area on the plane of the substrate, and a material of the semiconductor layer comprises an oxide semiconductor material; and
   forming word line structures, wherein a word line structure is located in the groove and at least covers part of the semiconductor layer.

10. The method for manufacturing of claim 9, wherein before the semiconductor layers are formed, the method further comprises:

forming an insulation layer, wherein the insulation layer covers the inner walls of the grooves and the upper surface of the substrate;

removing the insulation layer located on the upper surface of the substrate; and etching the remaining insulation layers covering sidewalls of the grooves, to enable upper surfaces of the insulation layers located on the sidewalls of the grooves to be lower than the upper surface of the substrate.

11. The method for manufacturing of claim 9, wherein forming the semiconductor layers, each at least partially covering the inner wall of the groove comprises:

forming a semiconductor material layer, wherein the semiconductor material layer covers inner walls of the grooves and an upper surface of the substrate; and etching the semiconductor material layer to form a plurality of discrete semiconductor layers, wherein projections of the semiconductor layers on a plane of the substrate at least partially overlap with projections of the active areas on the plane of the substrate, each of the semiconductor layer comprises a first sublayer, a second sublayer and a third sublayer, the first sublayer covers a bottom surface and sidewalls of the groove, and the second sublayer and the third sublayer are located on two sides of the groove and cover part of the upper surface of the substrate.

12. The method for manufacturing of claim 11, wherein before the semiconductor layers are formed, the method further comprises:

forming an insulation layer, wherein the insulation layer covers the inner walls of the grooves and the upper surface of the substrate.

13. The method for manufacturing of claim 11, wherein after the word line structures are formed, the method further comprises:

forming a dielectric layer;

etching the dielectric layer to form first contacts, wherein second sublayers are exposed by the first contacts;

forming first contact plugs in the first contacts, wherein the first contact plugs are in contact with the second sublayers; and forming a plurality of bit line structures extending in a second direction, wherein the bit line structures are in electrical contact with tops of the first contact plugs.

14. The method for manufacturing of claim 13, wherein after the bit line structures are formed, the method further comprises:

forming a plurality of isolation barriers extending in the first direction, wherein the plurality of isolation barriers and the plurality of bit line structures enclose a plurality of openings, and third sublayers are exposed from the openings; and forming second contact plugs in the openings, wherein the second contact plugs are in contact with the third sublayers.

15. The semiconductor structure of claim 1, wherein the substrate comprises a plurality of discrete active areas, each active area comprising first source/drain doped areas located on the two end portions and a second source/drain doped area located in the intermediate area, and wherein, the semiconductor layer covers at least part of a surface of the active area exposed by the groove, and wherein the first source/drain doped area and the second source/drain doped area are respectively located on two sides of the semiconductor layer and are in contact with the semiconductor layer.

16. The semiconductor structure of claim 1, wherein the substrate comprises a plurality of discrete active areas, each active area comprising a first source/drain doped area and a second source/drain doped area, wherein, the oxide semiconductor material is a doped oxide semiconductor material, and has a doping type opposite to that of the first source/drain doped area and the second source/drain doped area.

17. The semiconductor structure of claim 1, wherein the substrate comprises isolation structures and a plurality of discrete active areas separated by the isolation structures, and each groove penetrates the active areas and the isolation structures along the first direction, wherein, the semiconductor layer is only located on a surface of the active area exposed by the groove, but not on a surface of the isolation structure exposed by the groove.

18. A semiconductor structure, comprising:

a substrate;

a plurality of grooves, located in the substrate and extending in a first direction;

a plurality of word line structures, located in the grooves; and a plurality of semiconductor layers, each semiconductor layer being at least partially located between a word line structure and an inner wall of a groove, wherein the semiconductor layer comprises oxide semiconductor material, wherein the semiconductor layer comprises a first sublayer, a second sublayer and a third sublayer, the first sublayer covers a bottom surface and sidewalls of the groove, the second sublayer and the third sublayer are located on two sides of the groove, and cover part of an upper surface of the substrate;

a plurality of bit line structures, located on the substrate and extending in a second direction that interacts with the first direction; and first contact plugs, each located under a bit line structure and above the second sublayer, wherein the first contact plug is electrically connected to the bit line structure and the second sublayer.

19. The semiconductor structure of claim 18, further comprising:

each of the bit line structures comprises a bit line, a bit line cover layer and bit line sidewall layers, the bit line cover layer covers an upper surface of the bit line, and the bit line sidewall layers cover the bit line cover layer, the bit line and sidewalls of the first contact plugs.

* * * * *